(12) United States Patent
Han

(10) Patent No.: US 10,546,716 B2
(45) Date of Patent: Jan. 28, 2020

(54) METHOD FOR OPERATING A PRESSURE SYSTEM OF A DEVICE FOR IMAGING, ANALYZING AND/OR PROCESSING AN OBJECT AND A DEVICE FOR CARRYING OUT THE METHOD

(71) Applicant: Carl Zeiss Microscopy GmbH, Jena (DE)

(72) Inventor: Luyang Han, Heidenheim (DE)

(73) Assignee: Carl Zeiss Microscopy GmbH, Jena (DE)

( * ) Notice: Subject to any disclaimer, the term of this patent is extended or adjusted under 35 U.S.C. 154(b) by 0 days.

(21) Appl. No.: 16/286,679

(22) Filed: Feb. 27, 2019

(65) Prior Publication Data

US 2019/0295811 A1    Sep. 26, 2019

(30) Foreign Application Priority Data

Mar. 1, 2018  (DE) .......................... 10 2018 203 096

(51) Int. Cl.
*H01J 37/18*  (2006.01)
*H01J 37/16*  (2006.01)
(Continued)

(52) U.S. Cl.
CPC .............. *H01J 37/16* (2013.01); *H01J 37/18* (2013.01); *H01J 37/244* (2013.01); *H01J 37/28* (2013.01);
(Continued)

(58) Field of Classification Search
CPC .......... H01J 37/16; H01J 37/18; H01J 37/244; H01J 37/28; H01J 37/301; H01J 49/24;
(Continued)

(56) References Cited

U.S. PATENT DOCUMENTS 7,301,157 B2 *  11/2007  Buijsse ................... H01J 37/18
                                                    250/311
2006/0284108 A1   12/2006  Buijsse et al.
(Continued)

FOREIGN PATENT DOCUMENTS

DE   20 2012 007 108 U1   10/2012
WO   WO 2002/067286 A2     8/2002

*Primary Examiner* — David E Smith
(74) *Attorney, Agent, or Firm* — Muirhead and Saturnelli, LLC

(57) ABSTRACT

Operating a pressure system of a device for imaging, analyzing and/or processing an object, and a particle beam device for carrying out this method. In particular, the particle beam device is an electron beam device and/or an ion beam device. The method may include disconnecting a pump from a pressure reservoir, connecting the pressure reservoir to a vacuum chamber, measuring a reservoir pressure existing in the pressure reservoir, determining a first pressure value of the reservoir pressure at a first time and a second pressure value of the reservoir pressure at a second time, determining a functional relationship between the first pressure value of the reservoir pressure and the second pressure value of the reservoir pressure, extrapolating the functional relationship for times later than the second time, determining a threshold time using the extrapolated functional relationship, and determining a remaining time period until the reservoir pressure reaches the pressure threshold.

19 Claims, 16 Drawing Sheets

(51) Int. Cl.
*H01J 37/244* (2006.01)
*H01J 37/28* (2006.01)

(52) U.S. Cl.
CPC . *H01J 2237/18* (2013.01); *H01J 2237/24585* (2013.01)

(58) Field of Classification Search
CPC ............. H01J 2237/18; H01J 2237/182; H01J 2237/1825; H01J 2237/188; H01J 2237/24585
See application file for complete search history.

(56) References Cited

U.S. PATENT DOCUMENTS

| | | | | |
|---|---|---|---|---|
| 2007/0043534 | A1* | 2/2007 | Arruda | G01M 3/3236 |
| | | | | 702/183 |
| 2010/0230590 | A1* | 9/2010 | Bierhoff | H01J 37/16 |
| | | | | 250/310 |

* cited by examiner

METHOD FOR OPERATING A PRESSURE SYSTEM OF A DEVICE FOR IMAGING, ANALYZING AND/OR PROCESSING AN OBJECT AND A DEVICE FOR CARRYING OUT THE METHOD

TECHNICAL FIELD

The system described herein relates to a method for operating a pressure system of a device for imaging, analyzing and/or processing an object. Moreover, the system described herein relates to a particle beam device for carrying out this method. In particular, the particle beam device is an electron beam device and/or an ion beam device.

BACKGROUND OF THE INVENTION

Electron beam devices, in particular a scanning electron microscope (also referred to as SEM below) and/or a transmission electron microscope (also referred to as TEM below), are used to examine objects (also referred to as samples) in order to obtain knowledge in respect of the properties and behavior of the objects under certain conditions.

In an SEM, an electron beam (also referred to as primary electron beam below) is generated by means of a beam generator and focused on an object to be examined, by means of a beam guiding system. An objective lens is used for focusing purposes. The primary electron beam is guided over a surface of the object to be examined by means of a deflection device. This is also referred to as scanning. The area scanned by the primary electron beam is also referred to as scanning region. Here, the electrons of the primary electron beam interact with the object to be examined. Interaction particles and/or interaction radiation result as a consequence of the interaction. By way of example, the interaction particles are electrons. In particular, electrons are emitted by the object—the so-called secondary electrons—and electrons of the primary electron beam are scattered back—the so-called backscattered electrons. The interaction particles form the so-called secondary particle beam and are detected by at least one particle detector. The particle detector generates detection signals which are used to generate an image of the object. An image of the object to be examined is thus obtained. By way of example, the interaction radiation is X-ray radiation or cathodoluminescence light. At least one radiation detector is used to detect the interaction radiation.

In the case of a TEM, a primary electron beam is likewise generated by means of a beam generator and directed onto an object to be examined, by means of a beam guiding system. The primary electron beam passes through the object to be examined. When the primary electron beam passes through the object to be examined, the electrons of the primary electron beam interact with the material of the object to be examined. The electrons passing through the object to be examined are imaged onto a luminescent screen or onto a detector—for example in the form of a camera—by a system comprising an objective. By way of example, the aforementioned system additionally also comprises a projection lens. Here, imaging may also take place in the scanning mode of a TEM. Such a TEM is referred to as STEM. Additionally, provision may be made for detecting electrons scattered back at the object to be examined and/or secondary electrons emitted by the object to be examined, by means of at least one further detector in order to image the object to be examined.

Combining the functions of an STEM and an SEM in a single particle beam device is known. It is therefore possible to carry out examinations of objects with an SEM function and/or with an STEM function using this particle beam device.

Moreover, a particle beam device in the form of an ion beam column is known. Ions used for processing an object are generated using an ion beam generator arranged in the ion beam column. By way of example, material of the object is ablated or material is applied onto the object during the processing. The ions are additionally or alternatively used for imaging.

Furthermore, the prior art has disclosed the practice of analyzing and/or processing an object in a particle beam device using, on the one hand, electrons and, on the other hand, ions. By way of example, an electron beam column having the function of an SEM is arranged at the particle beam device. Additionally, an ion beam column, which has been explained further above, is arranged at the particle beam device. The electron beam column with the SEM function serves, in particular, for examining further the processed or unprocessed object, but also for processing the object.

When generating an image of the object, the user of an electron beam device is always intent on obtaining the ideal image quality of an image of the object which is required for examining an object. Expressed differently, a user always wishes to generate an image of the object with such a high image quality that the user is able to analyze the object to be examined well on account of the image and the image information contained therein.

As mentioned above, it is also possible to detect interaction radiation, for example cathodoluminescence light and X-ray radiation. When detecting interaction radiation, a user of an electron beam device may, above all, be intent on obtaining the quality of the representation of the detection signals of a radiation detector based on the detected interaction radiation which is required for examining an object. By way of example, if X-ray radiation is detected by the radiation detector, the quality of the representation is determined e.g. by a good detection signal of the radiation detector.

The quality of an image and of the representation of the detection signals based on the detected interaction radiation depend on vibrations, in particular generated by pumps used to generate a vacuum within the electron beam device and by valves connecting chambers of the electron beam device to the pumps. A known electron beam device comprises a vacuum chamber. The vacuum chamber may comprise a particle generator for generating an electron beam having electrons and/or may comprise the object to be imaged, analyzed and/or processed. A turbomolecular pump is in fluid connection with the vacuum chamber. Moreover, the turbomolecular pump is in fluid connection with a vacuum reservoir. A first valve is arranged between the turbomolecular pump and the vacuum reservoir. The fluid connection between the turbomolecular pump and the vacuum reservoir may be connected or disconnected using the first valve. The vacuum reservoir is in fluid connection with a roughing pump. A second valve is arranged between the vacuum reservoir and the roughing pump. The fluid connection between the vacuum reservoir and the roughing pump may be connected or disconnected using the second valve.

The roughing pump is used for establishing a vacuum with a low vacuum reservoir pressure existing in the vacuum reservoir. The low vacuum reservoir pressure may be equal to or higher than 0.1 Pa. When the vacuum reservoir pressure reaches a low threshold, the roughing pump is disconnected from the vacuum reservoir. The low threshold may be 0.2 Pa, example. In other words, the second valve is closed such that the fluid connection between the vacuum reservoir and the roughing pump is disrupted. Moreover, the vacuum reservoir is connected to the vacuum chamber. In other words, the fluid connection between the vacuum reservoir and the vacuum chamber is established by opening the first valve. When the fluid connection between the vacuum chamber and the vacuum reservoir is established, the vacuum reservoir pressure existing in the vacuum reservoir increases. When the vacuum reservoir pressure reaches a given threshold of the vacuum reservoir pressure, the first valve is closed such that the fluid connection between the vacuum chamber and the vacuum reservoir is disrupted. Moreover, the roughing pump is connected again to the vacuum reservoir by opening the second valve. The vacuum reservoir is evacuated using the roughing pump. The above-mentioned circle may be repeated as much as needed and while the electron beam device is in operation.

The opening and closing of the first valve and the second valve may cause disturbances to the electron beam device. These disturbances may be vibrations. Moreover, the vibrations may be caused by evacuating the vacuum reservoir. If an object is imaged during the occurrence of such disturbances, the obtained image of the object may be of insufficient quality and, therefore, imaging of the object has to be repeated for obtaining a high-quality image of the object. The aforementioned may also be a problem when large objects are automatically imaged and when a user of the electron beam device is not present all the time during imaging. An image of a large object may take up to hundreds of hours. If several of the disturbances occur at different times during the whole process of imaging the large object, several of the obtained images may be of insufficient quality. A user has to manually pick out those images not being of sufficient quality and recapture those images. Moreover, the disturbances may cause damage during an operation using a micromanipulator used for arranging the object within an object chamber of the electron beam device. The micromanipulator may collide with the object or with a part of the electron beam device when those disturbances occur. This may destroy the object and damage the micromanipulator.

Accordingly, it is desirable to provide a method for imaging not impaired by the aforementioned disturbances. As one possible solution it is known to leave the first valve and the second valve open such that there always exists a fluid connection between the vacuum chamber, the vacuum reservoir and the roughing pump. However, this may also have a negative influence on the quality of the obtained images since a roughing pump having a constant fluid connection would keep running, which may lead to a decrease of the signal-to-noise ratio with respect to the obtained images.

Therefore, it is an object of the system described herein to specify a method for operating a pressure system, in particular a vacuum system, of a device for imaging, analyzing and/or processing an object and a device for carrying out this method which provide for sufficient quality of an image of the object although disturbances caused by valves might occur.

SUMMARY OF THE INVENTION

Described herein is a method for operating a pressure system, in particular a vacuum system, of a device for imaging, analyzing and/or processing an object, and a device for carrying out this method, which provide for sufficient quality of an image of the object although disturbances caused by valves might occur.

A method according to the system described herein is used for operating a pressure system of a device for imaging, analyzing and/or processing an object. The pressure system may be, for example, a vacuum system and/or a damping unit of the aforementioned device. The vacuum system may comprise at least one chamber being under vacuum and at least one pump for generating the vacuum. The aforementioned device may be arranged on the damping unit which may be, in turn, arranged on a surface. The surface may be, for example, a flooring of a room. The damping unit may be used for damping vibrations which might be transferred to the aforementioned device via the flooring.

The device for imaging, analyzing and/or processing an object may be a particle beam device, in particular an electron beam device and/or an ion beam device. The particle beam device may comprise at least one particle generator for generating a particle beam having charged particles and at least one objective lens for focusing the particle beam onto the object. The charged particles may be electrons and/or ions. Moreover, the particle beam device may comprise at least one detector for detecting interaction particles and/or interaction radiation, the interaction particles and the interaction radiation being generated when the particle beam impinges on the object. The interaction particles may be secondary particles, for example secondary electrons, or backscattered particles, for example backscattered electrons. The interaction radiation may be X-rays or cathodoluminescence light.

The device for imaging, analyzing and/or processing an object, in particular the particle beam device, may comprise at least one vacuum chamber. An object to be imaged, analyzed and/or processed may be or is arranged in the vacuum chamber. Moreover, the aforementioned device may have a pressure reservoir. The pressure reservoir may be in fluid connection with at least one pump. A valve may be arranged between the pressure reservoir and the pump. The fluid connection between the pressure reservoir and the pump may be connected or disconnected using the valve.

The method according to the system described herein may comprise the step of disconnecting the pump from the pressure reservoir. In other words, the fluid connection between the pressure reservoir and the pump may be disconnected. For example, the valve may be closed to disconnect the pump from the pressure reservoir.

The method according to the system described herein also may comprise the step of measuring the reservoir pressure existing in the pressure reservoir. For example, a pressure measuring unit arranged at the pressure reservoir may be used for measuring the reservoir pressure. In particular, at least one first pressure value of the reservoir pressure at a first time T1 and at least one second pressure value of the reservoir pressure at a second time T2 may be determined, where the second time T2 is later than the first time T1. The system described herein is not restricted to determining two pressure values, namely the first pressure value of the reservoir pressure at the first time T1 and the second pressure value of the reservoir pressure at the second time T2. Rather, the system described herein also may comprise determining more than two pressure values of the reservoir pressure, each at different times, in particular 5, 10, 15, 20 or up to 100 pressure values of the reservoir pressure, each pressure value of the reservoir pressure determined at a different time.

Moreover, the method according to the system described herein may comprise the step of determining a functional relationship between the first pressure value of the reservoir pressure and the second pressure value of the reservoir pressure. The functional relationship may be a function of time. The functional relationship may be determined by different methods, for example by interpolating the first pressure value of the reservoir pressure and the second pressure value of the reservoir pressure. Further methods are explained in more detail below. The functional relationship may be a linear relationship or a nonlinear relationship. A step function may also be comprised by the functional relationship or form the functional relationship.

A further step of the method according to the system described herein may comprise extrapolating the functional relationship for times later than the second time T2. In other words, it may be determined how the reservoir pressure of the pressure reservoir increases or decreases after the second time T2. In a further step of the method according to the system described herein, a threshold time may be determined using the extrapolated functional relationship. The threshold time may be a time when the extrapolated functional relationship reaches a pressure threshold given for the reservoir pressure. The pressure threshold may be given by a user and/or a control system of the device for imaging, analyzing and/or processing the object. The pressure threshold may be a pressure value which should not be exceeded or undershot; otherwise the pressure in the vacuum chamber and/or in the pressure reservoir may not be sufficient for good imaging, analyzing and/or processing the object in the device for imaging, analyzing and/or processing the object.

A further step of the method according to the system described herein may comprise determining a remaining time period until the reservoir pressure reaches the pressure threshold. The remaining time period may be a time difference between the threshold time and the second time T2. In other words, the remaining time period corresponds to the time which may be left until the reservoir pressure reaches the pressure threshold. A further step of the method according to the system described herein may comprise informing the user and/or the control system of the device for imaging, analyzing and/or processing the object about the remaining time period. In particular, the remaining time period may be displayed to the user.

The method according to the system described herein may have the advantage that the user and/or the control system of the device for imaging, analyzing and/or processing the object may be informed when disturbances caused by opening and closing of the valve might occur. Therefore, the user and/or the control system of the device for imaging, analyzing and/or processing the object know(s) when those disturbances might occur and may adjust to this situation. In particular, the user and/or the control system of the device for imaging, analyzing and/or processing the object may stop any imaging, analysis and/or processing the object while the pump may be connected to the pressure reservoir and the pressure reservoir may be evacuated or filled with air or a gas using the pump. This way, in particular the number of low quality images may be reduced. Moreover, the method according to the system described herein may be advantageous in particular for imaging large objects. Since the times of occurrences of the disturbances may be known, imaging of a large object may be stopped during the occurrences of the disturbances. This way, only images of the large object not impaired by the disturbances will be obtained. Those images may have a sufficient quality for analysis. Additionally, since the times of the occurrences of the disturbances may be known, operations such as using a micromanipulator used for arranging the object within an object chamber of the device for imaging, analyzing and/or processing the object may also be stopped during the occurrences of the disturbances. This way, the risk of destroying the object and of damaging the micromanipulator is lower.

It may be additionally or alternatively provided in an embodiment of the method according to the system described herein that the pressure reservoir is a vacuum reservoir, that the reservoir pressure is a vacuum reservoir pressure and that the pressure threshold is an upper threshold. The vacuum chamber may be in fluid connection with the vacuum reservoir. For example, a first valve may be arranged between the vacuum chamber and the vacuum reservoir. The fluid connection between the vacuum chamber and the vacuum reservoir may be connected or disconnected using the first valve. Moreover, the valve being arranged between the vacuum reservoir and the pump may be a second valve. The fluid connection between the vacuum reservoir and the pump may be connected or disconnected using the second valve. The embodiment of the method according to the system described herein may comprise the step of connecting the vacuum reservoir to the vacuum chamber after, during or before disconnecting the pump from the vacuum reservoir. In other words, a fluid connection between the vacuum chamber and the vacuum reservoir may be established. For example, the first valve may be opened for establishing the fluid connection between the vacuum chamber and the vacuum reservoir. Additionally or alternatively, a further pump may be arranged at the vacuum chamber. The further pump may be in fluid connection with the vacuum chamber. Moreover, the further pump may be in fluid connection with the vacuum reservoir. The first valve may be arranged between the further pump and the vacuum reservoir, for example. The fluid connection between the further pump, the vacuum reservoir and the vacuum chamber may be connected or disconnected using the first valve.

It is additionally or alternatively provided in an embodiment of the method according to the system described herein that the pressure reservoir is an overpressure reservoir of a damping unit and that the reservoir pressure is an overpressure reservoir pressure, wherein the pressure threshold is a lower threshold.

As mentioned already above, it is additionally or alternatively provided in an embodiment of the method according to the system described herein that the method comprises stopping imaging, analyzing and/or processing the object using the device for imaging, and analyzing and/or processing the object after the remaining time period, i.e., when the threshold time is reached. The pump may be connected to the pressure reservoir. Moreover, if the pressure reservoir is the vacuum reservoir, the vacuum reservoir may be disconnected from the vacuum chamber. Therefore, there may be no imaging, analyzing and/or processing the object using the device for imaging, analyzing and/or processing the object while the pump is connected to the pressure reservoir.

Moreover, it is additionally or alternatively provided in an embodiment of the method according to the system described herein that the method provides not only for a single remaining time period of a single pressure reservoir of the device for imaging, analyzing and/or processing the object. Rather, the embodiment of the method according to the system described herein provides for several remaining time periods of several pressure reservoirs of the device for imaging, analyzing and/or processing the object. Accordingly, the pressure reservoir of the device for imaging, analyzing and/or processing the object may be a first pressure reservoir, and the reservoir pressure may be a first reservoir pressure. Furthermore, the pump may be a first pump and the pressure threshold may be a first pressure threshold. Moreover, the threshold time may be a first threshold time and the functional relationship may be a first functional relationship. A second pressure reservoir may be in fluid connection with at least one second pump. A valve may be arranged between the second pressure reservoir and the second pump. The fluid connection between the second pressure reservoir and the second pump may be connected or disconnected using this valve. Additionally or alternatively, a further pump may be arranged at the vacuum chamber, the further pump being in fluid connection with the vacuum chamber and in fluid connection with the second pressure reservoir. A valve may be arranged between the further pump and the second pressure reservoir. The fluid connection between the further pump, the second pressure reservoir and the vacuum chamber may be connected or disconnected using this valve.

This embodiment of the method according to the system described herein may comprise the step of disconnecting the second pump from the second pressure reservoir. In other words, the fluid connection between the second pressure reservoir and the second pump may be disconnected. For example, the valve may be closed to disconnect the second pump from the second vacuum reservoir.

This embodiment of the method according to the system described herein also may comprise the step of measuring a second reservoir pressure existing in the second pressure reservoir. For example, a further pressure measuring unit arranged at the second pressure reservoir may be used for measuring the second reservoir pressure. In particular, at least one first pressure value of the second reservoir pressure at a third time T3 and at least one second pressure value of the second reservoir pressure at a fourth time T4 may be determined. The fourth time T4 may be later than the third time T3. The system described herein may not be restricted to determining two pressure values, namely the first pressure value of the second reservoir pressure at the third time T3 and the second pressure value of the second reservoir pressure at the fourth time T4. Rather, the system described herein also may comprise determining more than two pressure values of the second reservoir pressure, each at different times, in particular 5, 10, 15, 20 or up to 100 pressure values of the second reservoir pressure, each pressure value of the second reservoir pressure determined at a different time.

Moreover, this embodiment of the method according to the system described herein may comprise the step of determining a second functional relationship between the first pressure value of the second reservoir pressure and the second pressure value of the second reservoir pressure. The second functional relationship may be a second function of time. The second functional relationship may be determined by different methods, for example, by interpolating the first pressure value of the second reservoir pressure and the second pressure value of the second reservoir pressure. Further methods are explained in more detail below. The second functional relationship may be a linear relationship or a nonlinear relationship. A step function may also be comprised by the second functional relationship or form the second functional relationship.

A further step of this embodiment of the method according to the system described herein may comprise extrapolating the second functional relationship for times later than the fourth time T4. In other words, it may be determined how the second reservoir pressure of the second pressure reservoir increases or decreases after the fourth time T4. In a further step of the embodiment of the method according to the system described herein, a second threshold time may be determined using the extrapolated second functional relationship. The second threshold time may be a time when the extrapolated second functional relationship reaches a second pressure threshold given for the second reservoir pressure. The second pressure threshold may be given by the user and/or the control system of the device for imaging, analyzing and/or processing the object. The second pressure threshold may be a pressure value which should not be exceeded or undershot; otherwise the pressure in the vacuum chamber and/or in the second pressure reservoir may not be sufficient for good imaging, analyzing and/or processing the object in the device for imaging, analyzing and/or processing the object.

A further step of this embodiment of the method according to the system described herein may comprise determining a second remaining time period until the second reservoir pressure reaches the second pressure threshold. The second remaining time period may be a time difference between the second threshold time and the fourth time T4. In other words, the second remaining time period corresponds to the time which may be left until the second reservoir pressure reaches the second pressure threshold. In a further step of the embodiment of the method according to the system described herein, the method may comprise informing the user and/or the control system of the device for imaging, analyzing and/or processing the object about the second remaining time period. In particular, the second remaining time period may be displayed to the user.

It is additionally or alternatively provided in an embodiment of the method according to the system described herein that the second pressure reservoir is a second vacuum reservoir, that the second reservoir pressure is a second vacuum reservoir pressure and that the second pressure threshold is a second upper threshold. The vacuum chamber may be in fluid connection with the second vacuum reservoir. A third valve may be arranged between the vacuum chamber and the second vacuum reservoir. The fluid connection between the vacuum chamber and the second vacuum reservoir may be connected or disconnected using the third valve. Moreover, the valve being arranged between the second vacuum reservoir and the second pump may be a fourth valve. The fluid connection between the second vacuum reservoir and the second pump may be connected or disconnected using the fourth valve. The embodiment of the method according to the system described herein may comprise the step of connecting the second vacuum reservoir to the vacuum chamber after, during or before disconnecting the second pump from the second vacuum reservoir. In other words, a fluid connection between the vacuum chamber and the second vacuum reservoir may be established. For example, the third valve may be opened for establishing the fluid connection between the vacuum chamber and the second vacuum reservoir. Additionally or alternatively, a further pump may be arranged at the vacuum chamber. The further pump may be in fluid connection with the vacuum chamber. Moreover, the further pump may be in fluid connection with the second vacuum reservoir. The third valve may be arranged between the further pump and the second vacuum reservoir, for example. The fluid connection between the further pump, the second vacuum reservoir and the vacuum chamber may be connected or disconnected using the third valve.

It is additionally or alternatively provided in an embodiment of the method according to the system described herein that the second pressure reservoir is a second overpressure reservoir of the damping unit and that the second reservoir pressure is a second overpressure reservoir pressure, wherein the second pressure threshold is a second lower threshold.

It is additionally or alternatively provided in a further embodiment of the method according to the system described herein that the first pump is identical to the second pump. In other words, the first pressure reservoir and the second pressure reservoir may be in fluid connection with identical pumps. Furthermore, it is additionally or alternatively provided in an embodiment of the method according to the system described herein that the first functional relationship is identical to the second functional relationship.

It is additionally or alternatively provided in another embodiment of the method according to the system described herein that the method comprises informing the user and/or the control system of the device for imaging, analyzing and/or processing the object about which one of the first remaining time period and the second remaining time period is shorter. Additionally or alternatively, the method comprises informing the user and/or the control system of the device for imaging, analyzing and/or processing the object about which one of the first remaining time period and the second remaining time period is shorter if the time difference between the first remaining time period and the second remaining time period is shorter than 1 minute or 2 minutes. The aforementioned embodiment of the method according to the system described herein is based on the following thoughts. As mentioned above, the device for imaging, analyzing and/or processing the object may comprise several pressure reservoirs. Each of the several pressure reservoirs may be monitored and the remaining time period for each pressure reservoir may be determined. The user and/or the control system of the device for imaging, analyzing and/or processing the object may be informed about the time of the next disturbance which has the smallest value of all remaining time periods with respect to the several monitored pressure reservoirs. Moreover, if the disturbances with respect to the several pressure reservoirs are close together in time, the embodiment of the method according to the system described herein may combine those disturbances to a single disturbance such that the user and/or the control system of the device for imaging, analyzing and/or processing the object may be informed about a single disturbance with respect to the pressure reservoirs only, wherein the single disturbance may be given by the shortest remaining time period of all remaining time periods of the monitored pressure reservoirs.

A further method according to the system described herein is also used for operating a pressure system of a device for imaging, analyzing and/or processing an object. The further method may be combined with the method comprising at least one of the above mentioned steps or a combination of at least two of the above mentioned steps. The pressure system may be, for example, a vacuum system and/or a damping unit of the aforementioned device. The vacuum system may comprise at least one chamber being under vacuum and at least one pump for generating the vacuum. The aforementioned device may be arranged on the damping unit which may be, in turn, arranged on a surface. The surface may be, for example, a flooring of a room. The damping unit may be used for damping vibrations which might be transferred to the aforementioned device via the flooring.

The device for imaging, analyzing and/or processing an object, in which the further method may be used, may be a particle beam device, in particular an electron beam device and/or an ion beam device. The particle beam device may comprise at least one particle generator for generating a particle beam having charged particles and at least one objective lens for focusing the particle beam onto the object. The charged particles may be electrons and/or ions. Moreover, the particle beam device may comprise at least one detector for detecting interaction particles and/or interaction radiation, the interaction particles and the interaction radiation being generated when the particle beam impinges on the object. The interaction particles may be secondary particles, for example secondary electrons, or backscattered particles, for example backscattered electrons. The interaction radiation may be X-rays or cathodoluminescence light.

The device for imaging, analyzing and/or processing an object, in particular the particle beam device, may comprise at least one vacuum chamber. An object to be imaged, analyzed and/or processed may be or is arranged in the vacuum chamber. Moreover, the aforementioned device may have a pressure reservoir. Moreover, the pressure reservoir may be in fluid connection with at least one pump. A valve may be arranged between the pressure reservoir and the pump. The fluid connection between the pressure reservoir and the pump may be connected or disconnected using the valve.

The further method according to the system described herein may comprise the step of disconnecting the pump from the pressure reservoir. In other words, the fluid connection between the pressure reservoir and the pump may be disconnected. For example, the valve may be closed to disconnect the pump from the pressure reservoir.

The further method according to the system described herein also may comprise the step of measuring the reservoir pressure existing in the pressure reservoir. For example, a pressure measuring unit arranged at the pressure reservoir may be used for measuring the reservoir pressure. Moreover, it may be determined when the reservoir pressure reaches a pressure threshold given for the reservoir pressure. The pressure threshold may be given by a user and/or a control system of the device for imaging, analyzing and/or processing the object. The pressure threshold may be a pressure value which should not be exceeded or undershot; otherwise the pressure in the vacuum chamber and/or in the pressure reservoir may not be sufficient for good imaging, analyzing and/or processing the object in the device for imaging, analyzing and/or processing the object.

The further method according to the system described herein may comprise the step of stopping imaging, analyzing and/or processing the object during a given delay after the reservoir pressure has reached the pressure threshold. The given delay may be a time period of less than two minutes, less than one minute or less than 30 seconds. The further method according to the system described herein also may comprise connecting the pump to the pressure reservoir. For example, the valve may be opened to establish a fluid connection between the pressure reservoir and the pump. Therefore, imaging, analyzing and/or processing the object may be stopped while the pump is connected to the pressure reservoir.

It is additionally or alternatively provided in an embodiment of the further method according to the system described herein that the method comprises that the pressure reservoir is a vacuum reservoir and that the reservoir pressure is a vacuum reservoir pressure, wherein the pressure threshold is an upper threshold and wherein, after disconnecting the pump from the vacuum reservoir, the vacuum reservoir is connected to a vacuum chamber of the device.

For example, a valve may be closed or opened to disrupt the fluid connection between the vacuum reservoir and the vacuum chamber. Moreover, the vacuum reservoir may be disconnected from the vacuum chamber with the given delay after the vacuum reservoir pressure has reached the pressure threshold.

It is additionally or alternatively provided in an embodiment of the further method according to the system described herein that the method comprises that the pressure reservoir is an overpressure reservoir of a damping unit and that the reservoir pressure is an overpressure reservoir pressure, wherein the pressure threshold is a lower threshold.

The further method according to the system described herein may have the advantage that the user and/or the control system of the device for imaging, analyzing and/or processing the object may finish a process of imaging, analyzing and/or processing the object before the disturbances will occur. This way, in particular the number of low quality images may be reduced. Moreover, the further method according to the system described herein also may be advantageous in particular for imaging large objects or automated processes of imaging an object. Additionally, since the disturbances will not start before specific operations within the device for imaging, analyzing and/or processing the object may have been stopped, damages to the object and/or to parts of the device for imaging, analyzing and/or processing the object may be avoided, in particular damages to the object or to a micromanipulator used for arranging the object within the device for imaging, analyzing and/or processing the object.

The system described herein also refers to a computer program product comprising a program code which may be loaded or is loaded into a processor and which, when being executed, controls a particle beam device in such a way that a method comprising at least one of the above mentioned or further below mentioned steps or a combination of at least two of the above mentioned or further below mentioned steps is carried out.

The system described herein also may include a particle beam device for imaging, analyzing and/or processing an object. The particle beam device may comprise at least one particle generator for generating a particle beam comprising charged particles. The charged particles may be electrons and/or ions. The particle beam device according to the system described herein also may have at least one objective lens for focusing the particle beam onto the object. Moreover, the particle beam device according to the system described herein may have at least one detector for detecting interaction particles and/or interaction radiation, the interaction particles and the interaction radiation being generated when the particle beam impinges on the object. The interaction particles may be secondary particles and/or backscattered particles, in particular secondary electrons and backscattered electrons. The interaction radiation may be X-rays and/or cathodoluminescence light.

Moreover, the particle beam device according to the system described herein may comprise a vacuum chamber. The vacuum chamber may be an object chamber in which an object to be imaged, analyzed and/or to be processed may be arranged. Additionally or alternatively, the vacuum chamber may be any chamber in which those parts of the particle beam device are arranged which require a vacuum surrounding. Moreover, the particle beam device according to the system described herein may comprise at least one pressure reservoir. Additionally, at least one pump may be adapted to be in fluid connection with the pressure reservoir. In one embodiment of the particle beam device according to the system described herein, a first valve may be arranged between the vacuum chamber and the pressure reservoir. In a further embodiment of the particle beam device according to the system described herein, a second valve may be arranged between the pressure reservoir and the pump.

The particle beam device according to the system described herein also may comprise at least one processor into which a computer program product, for example, the one mentioned above, may be loaded.

In an embodiment of the particle beam device according to the system described herein, it is additionally or alternatively provided that the pressure reservoir is one of the following: (i) a vacuum reservoir adapted to be in fluid connection with the vacuum chamber or (ii) an overpressure reservoir of a damping unit. The damping unit is explained further above.

In another embodiment of the particle beam device according to the system described herein, it is additionally or alternatively provided that the pressure reservoir is a lock chamber. The lock chamber may be an exchange chamber of the particle beam device into which an object may be introduced before it may be further introduced into the vacuum chamber of the particle beam device.

In a further embodiment of the particle beam device according to the system described herein, it is additionally or alternatively provided that the particle generator is a first particle generator for generating a first particle beam comprising first charged particles. The objective lens may be a first objective lens for focusing the first particle beam onto the object. The particle beam device according to the embodiment of the system described herein further may comprise a second particle generator for generating a second particle beam comprising second charged particles and a second objective lens for focusing the second particle beam onto the object. The second charged particles may be electrons and/or ions.

In a further embodiment of the particle beam device according to the system described herein, it is additionally or alternatively provided that the particle beam device is at least one of the following: an electron beam device and an ion beam device. In particular, the particle beam device may be both an electron beam device and an ion beam device.

BRIEF DESCRIPTION OF THE DRAWINGS

Embodiments of the system described herein will be explained in more detail in the following text with reference to the figures, in which.

DETAILED DESCRIPTION OF VARIOUS EMBODIMENTS

Illustrative embodiments of the system described herein will now be described in relation to the drawings. It should be appreciated that the system described herein is not limited to the following illustrative embodiments, as other embodiments, for example, variations of the following illustrative embodiments, are possible, and intended to fall within the scope of the invention.

Figure 1:
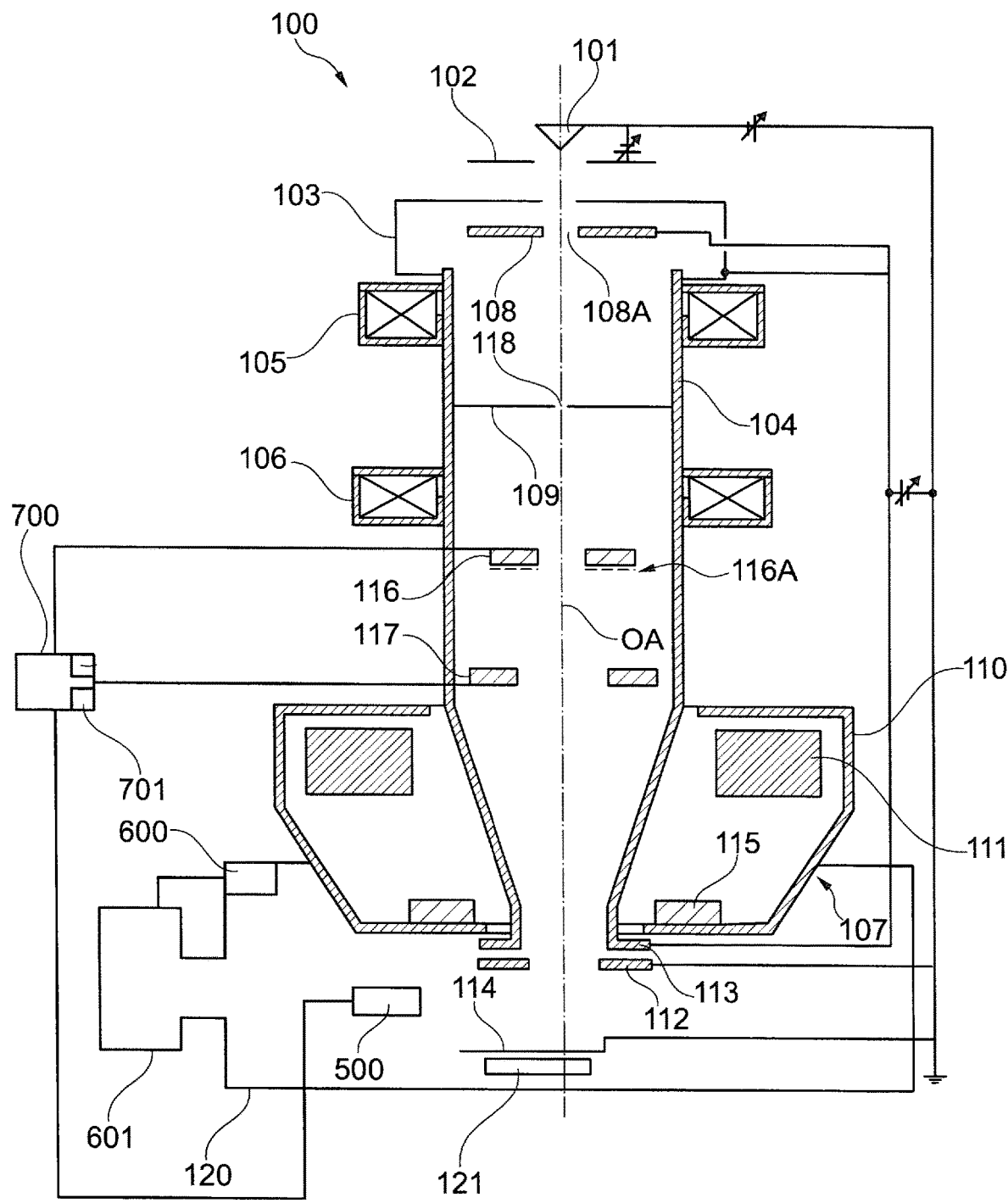
FIG. 1 shows a schematic representation of a first embodiment of a particle beam device.

FIG. 1 shows a schematic representation of an SEM 100. The SEM 100 has a beam generator in the form of an electron source 101 being a cathode, an extraction electrode 102, and an anode 103 which is arranged on the end of a beam guide tube 104 of the SEM 100. The electron source 101 is, for example, a thermal field emitter. However, the system described herein is not limited to such an electron source. Instead, any electron source may be used.

Electrons emerging from the electron source 101 form a primary electron beam. The electrons may be accelerated to an anode potential due to a potential difference between the electron source 101 and the anode 103. The anode potential in this exemplary embodiment is between 0.2 kV and 30 kV relative to the ground potential of an object chamber 120, for example, 5 kV to 15 kV, in particular 8 kV, but alternatively, it could also be at ground potential.

Two condenser lenses are arranged at the beam guide tube 104, i.e., a first condenser lens 105 and a second condenser lens 106, the first condenser lens 105 being situated first, and then the second condenser lens 106, as viewed from the electron source 101 toward an objective lens 107. However, the system described herein is not limited to the use of two condenser lenses. Instead, further embodiments may comprise only a single condenser lens.

A first aperture unit 108 is arranged between the anode 103 and the first condenser lens 105. The first aperture unit 108 is, together with the anode 103 and the beam guide tube 104, at high-voltage potential, i.e. the potential of the anode 103, or at ground potential. The first aperture unit 108 may have several first aperture openings 108A. One of those first aperture openings 108A is shown in FIG. 1. For example, the first aperture unit 108 has two first aperture openings 108A. Each of the several first aperture openings 108A may have a different opening diameter. A chosen first aperture opening 108A may be arranged at an optical axis OA of the SEM 100 using an adaption mechanism. However, the system described herein is not limited to this embodiment. Instead, in an alternative embodiment, the first aperture unit 108 may have a single first aperture opening 108A only. No adaption mechanism is used for this alternative embodiment. The first aperture unit 108 of this alternative embodiment is fixedly arranged around the optical axis OA.

A stationary second aperture unit 109 is arranged between the first condenser lens 105 and the second condenser lens 106. Alternatively, the second aperture unit 109 is moveable.

The objective lens 107 has pole pieces 110, in which a bore has been made. The beam guide tube 104 is arranged and guided through this bore. Further, a coil 111 is arranged in the pole pieces 110.

An electrostatic deceleration device is situated downstream from the beam guide tube 104. It has a single electrode 112 and a tube electrode 113 arranged at the end of the beam guide tube 104 facing an object 114. Consequently, the tube electrode 113 is, together with the beam guide tube 104, at the potential of the anode 103, while the single electrode 112 and the object 114 are at a lower potential than that of the anode 103. In this case, this is the ground potential of the object chamber 120. Thus, the electrons of the primary electron beam may be decelerated to the desired energy required for analyzing the object 114.

In addition, the SEM 100 has a scanning device 115, via which the primary electron beam may be deflected and scanned across the object 114. In this process, the electrons of the primary electron beam interact with the object 114. As a consequence of this interaction, interaction particles and/or interaction radiation will result, which are detected. The detection signals obtained in this manner are evaluated.

As interaction particles, in particular electrons are emitted from the surface of the object 114 (so-called secondary electrons) or electrons of the primary electron beam are scattered back (so-called backscattered electrons). For detecting secondary electrons and/or backscattered electrons, a detector system which has a first detector 116 and a second detector 117 is arranged in the beam guide tube 104. The first detector 116 is arranged on the source-side along the optical axis OA, while the second detector 117 is arranged on the object-side along the optical axis OA in the beam guide tube 104. In addition, the first detector 116 and the second detector 117 are arranged offset against each other toward the optical axis OA of the SEM 100. Both the first detector 116 and the second detector 117 each have a through opening through which the primary electron beam may pass, and they are approximately at the potential of the anode 103 and the beam guide tube 104. The optical axis OA of the SEM 100 passes through the corresponding through openings.

The second detector 117 is used to detect mostly secondary electrons. Secondary electrons emitting from the object 114 have a low kinetic energy and arbitrary direction of movements. However, the secondary electrons are accelerated due to a strong extraction field generated by the tube electrode 113 in the direction of the objective lens 107. The secondary electrons enter the objective lens 107 nearly parallel to the optical axis OA. A diameter of the beam bunch of the secondary electrons is small in the objective lens 107. The objective lens 107, however, affects the beam of secondary electrons and generates a short focus of the secondary electrons having relatively steep angles with respect to the optical axis OA such that the secondary electrons diverge from each other after the focus and may impinge on the second detector 117. Electrons backscattered on the object 114, i.e. backscattered electrons, have a relatively high kinetic energy as compared to secondary electrons when exiting from the object 114. Backscattered electrons are detected only to a very small degree by the second detector 117. The high kinetic energy and the angle of the beam of backscattered electrons with respect to the optical axis OA when backscattered at the object 114 result in a beam waist, i.e. a beam area having a minimal diameter, of the backscattered electrons, the beam waist being arranged in the vicinity of the second detector 117. Therefore, a large part of the backscattered electrons passes through the opening of the second detector 117. Accordingly, backscattered electrons are detected mainly by the first detector 116.

The first detector 116 of a further embodiment of the SEM 100 may have an opposing field grid 116A which is a field grid with an opposing potential. The opposing field grid 116A may be arranged at the side of the first detector 116 facing the object 114. The opposing field grid 116A may comprise a negative potential with respect to the potential of the beam guide tube 104 such that mainly or only backscattered electrons having a high energy may pass the opposing field grid 116A and impinge on the first detector 116. Additionally or alternatively, the second detector 117 may have a further opposing field grid being designed similar to the above mentioned opposing field grid 116A of the first detector 116 and having an analog function.

The detection signals generated by the first detector 116 and the second detector 117 are used to generate an image or images of the surface of the object 114.

It is pointed out expressly that the aperture openings of the first aperture unit 108 and the second aperture unit 109 as well as the through openings of the first detector 116 and the second detector 117 are represented in an exaggerated manner. The through openings of first detector 116 and the second detector 117 have a maximum length of between 1 mm and 5 mm perpendicular to the optical axis OA. For example, they have a circular design and a diameter in the range of 1 mm to 3 mm perpendicular to the optical axis OA.

In the exemplary embodiment shown here, the second aperture unit 109 is a circular aperture having a second aperture opening 118 for the primary electron beam to pass through, the second aperture opening 118 having an extension in the range of 25 µm to 50 µm, for example, 35 µm. The second aperture unit 109 may be a pressure stage aperture. The second aperture unit 109 of a further exemplary embodiment may have several openings which may be mechanically moved with respect to the primary electron beam or which may be passed through by the primary electron beam using electrical and/or magnetic deflection devices. As mentioned above, the second aperture unit 109 may also be a pressure stage unit. It separates a first area, in which the electron source 101 is arranged, having an ultra-high vacuum ($10^{-7}$ to $10^{-12}$ hPa), from a second area with a high vacuum ($10^{-3}$ to $10^{-7}$ hPa). The second area is the intermediate pressure area of the beam guide tube 104 leading to the object chamber 120.

In addition to the detector system mentioned above, the SEM 100 has a radiation detector 500 which is arranged in the object chamber 120. The radiation detector 500 is, for example, positioned between the beam guide tube 104 and the object 114. Moreover, the radiation detector 500 is positioned at the side of the object 114. The radiation detector 500 may be a CCD-detector.

The object chamber 120 is operated in a first pressure range or in a second pressure range, wherein the first pressure range may only comprise pressures lower than or equal to $10^{-3}$ hPa and wherein the second pressure range may only comprise pressures over $10^{-3}$ hPa. A pressure sensor 600 is arranged in the object chamber 120 for measuring the pressure in the object chamber 120. A vacuum system in the form of a pump system 601 being connected to the pressure sensor 600 and being arranged at the object chamber 120 provides for the pressure range, either the first pressure range or the second pressure range, in the object chamber 120.

The SEM 100 may further have a third detector 121 which is arranged in the object chamber 120. The third detector 121 is arranged downstream of the object 114 as seen from the electron source 101 in the direction of the object 114 along the optical axis OA. The primary electron beam may be transmitted through the object 114. Electrons of the primary electron beam interact with the material of the object 114. Electrons transmitted through the object 114 will be detected using the third detector 121.

The first detector 116, the second detector 117 and the radiation detector 500 are connected to a control unit 700. The control unit 700 comprises a processor 701 into which a computer program product comprising a program code is loaded, which, when being executed, controls the SEM 100 in such a way that a method according to the system described herein is carried out. This will be explained further below.

Figure 1A:
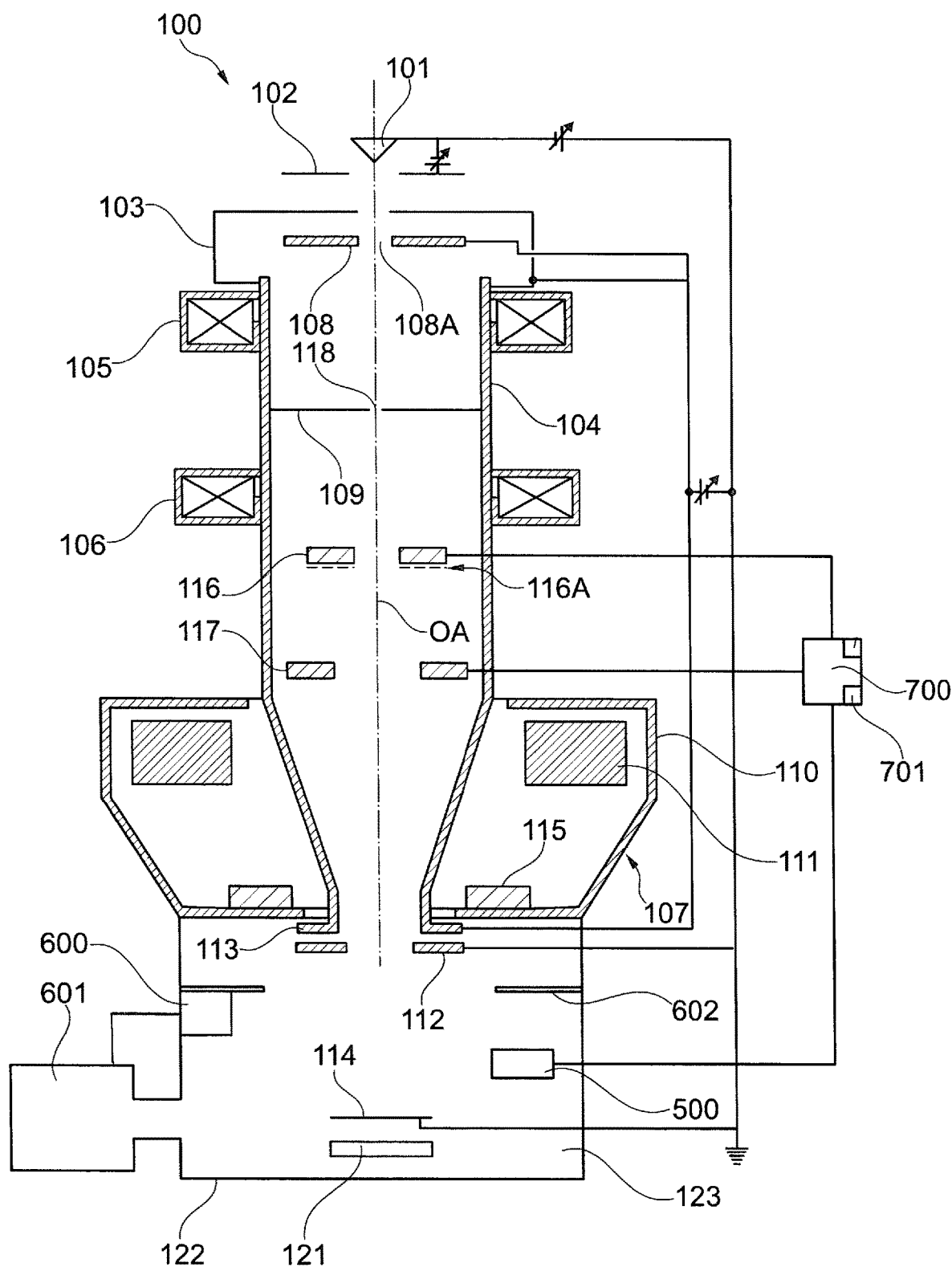
FIG. 1A shows a schematic representation of a second embodiment of a particle beam device.

FIG. 1A shows a schematic representation of a further SEM 100. The embodiment of FIG. 1A is based on the embodiment of FIG. 1. Identical reference signs denote identical components. In contrast to the SEM 100 of FIG. 1, the SEM 100 of FIG. 1A comprises an object chamber 122. A pressure limiting aperture 602 is arranged between the beam guide tube 104 and an object area 123 of the object chamber 122. The SEM 100 according to FIG. 1A is suited in particular for the SEM 100 being operated in the second pressure range.

Figure 2:
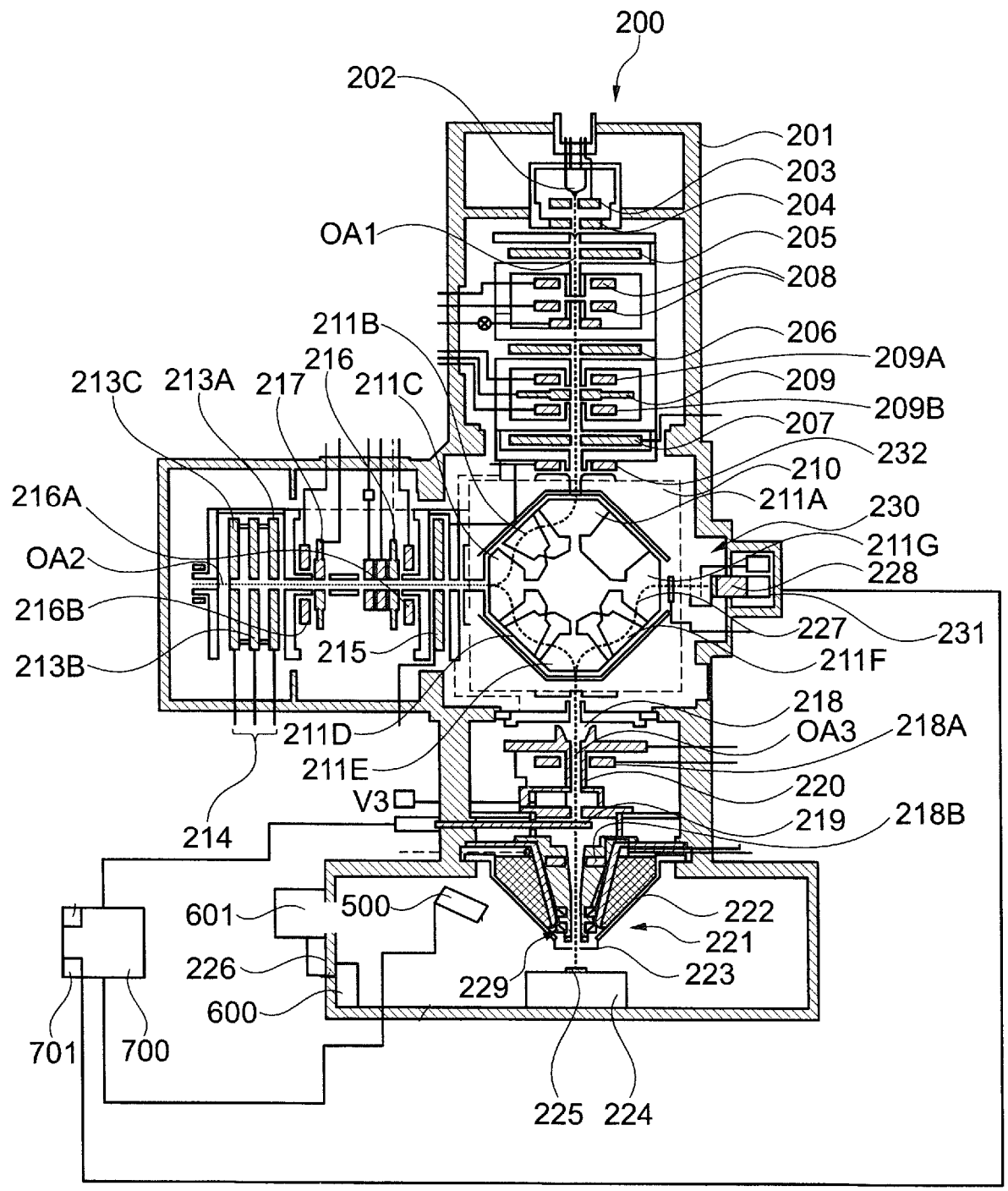
FIG. 2 shows a schematic representation of a third embodiment of a particle beam device.

FIG. 2 is a schematic illustration of a further embodiment of a particle beam device according to the system described herein. This embodiment of the particle beam device is denoted with reference sign 200 and comprises a mirror corrector for correcting, for example, chromatic and spherical aberrations. This will be explained in detail further below. The particle beam device 200 comprises a particle beam column 201 being embodied as an electron beam column and, in principle, corresponds to an electron beam column of a corrected SEM. However, the particle beam device 200 according to the system described herein is not restricted to an SEM with a mirror corrector. Rather, any particle beam device comprising correction units may be used.

The particle beam column 201 comprises a beam generator in the form of an electron source 202 being a cathode, an extraction electrode 203 and an anode 204. By way of example, the electron source 202 may be a thermal field emitter. Electrons which emerge from the electron source 202 are accelerated by the anode 204 as a result of a potential difference between the electron source 202 and the anode 204. Accordingly, a primary particle beam in the form of an electron beam is provided along a first optical axis OA1.

The primary particle beam is guided along a beam path which—after the primary particle beam has emerged from the electron source 202—is approximately the first optical axis OA1, using a first electrostatic lens 205, a second electrostatic lens 206 and a third electrostatic lens 207.

The primary particle beam is adjusted along the beam path using at least one beam alignment device. The beam alignment device of this embodiment comprises a gun alignment unit comprising two magnetic deflection units 208 arranged along the first optical axis OA1. Furthermore, the particle beam device 200 comprises electrostatic beam deflection units. A first electrostatic beam deflection unit 209 is arranged between the second electrostatic lens 206 and the third electrostatic lens 207. The first electrostatic beam deflection unit 209 is also arranged downstream of the magnetic deflection units 208. A first multipole unit 209A in the form of a first magnetic deflection unit is arranged at one side of the first electrostatic beam deflection unit 209. Furthermore, a second multipole unit 209B in the form of a second magnetic deflection unit is arranged at the other side of the first electrostatic beam deflection unit 209. The first electrostatic beam deflection unit 209, the first multipole unit 209A and the second multipole unit 209B are used for adjusting the primary particle beam with respect to an axis of the third electrostatic lens 207 and an entrance window of a beam deflection device 210. The first electrostatic beam deflection unit 209, the first multipole unit 209A and the second multipole unit 209B may act together as a Wien filter. A further magnetic deflection device 232 is arranged at the entrance of the beam deflection device 210.

The beam deflection device 210 is used as a particle-optical beam splitter which deflects the primary particle beam in a specific way. The beam deflection device 210 comprises several magnetic sectors, namely a first magnetic sector 211A, a second magnetic sector 211B, a third magnetic sector 211C, a fourth magnetic sector 211D, a fifth magnetic sector 211E, a sixth magnetic sector 211F and a seventh magnetic sector 211G. The primary particle beam enters the beam deflection device 210 along the first optical axis OA1 and is deflected by the beam deflection device 210 in the direction of a second optical axis OA2. The beam deflection is effected by the first magnetic sector 211A, the second magnetic sector 211B and the third magnetic sector 211C at an angle of 30° to 120°. The second optical axis OA2 is arranged at an identical angle to the first optical axis OA1. The beam deflection device 210 also deflects the primary particle beam which is guided along the second optical axis OA2 in the direction of a third optical axis OA3. The beam deflection is effected by the third magnetic sector 211C, the fourth magnetic sector 211D and the fifth magnetic sector 211E. In the embodiment shown in FIG. 2, deflecting to the second optical axis OA2 and to the third optical axis OA3 will be done by deflecting the primary particle beam at an angle of 90°. Thus, the third optical axis OA3 runs coaxially to the first optical axis OA1. However, the particle beam device 200 according to the system described herein is not restricted to deflection angles of 90°. Rather, any suitable deflection angle may be used with the beam deflection device 210, for example 70° or 110°, such that the first optical axis OA1 does not run coaxially to the third optical axis OA3. For further details of the beam deflection device 210, reference is made to WO 2002/067286 A2, which is incorporated herein by reference.

After being deflected by the first magnetic sector 211A, the second magnetic sector 211B and the third magnetic sector 211C, the primary particle beam is guided along the second optical axis OA2. The primary particle beam is guided to an electrostatic mirror 214 and passes—on its way to the electrostatic mirror 214—a fourth electrostatic lens 215, a third multipole unit 216A in the form of a magnetic deflection unit, a second electrostatic beam deflection unit 216, a third electrostatic beam deflection unit 217 and a fourth multipole unit 216B in the form of a magnetic deflection unit. The electrostatic mirror 214 comprises a first mirror electrode 213A, a second mirror electrode 213B and a third mirror electrode 213C. Electrons of the primary particle beam which are reflected back by the electrostatic mirror 214 run again along the second optical axis OA2 and enter again the beam deflection device 210. They are deflected by the third magnetic sector 211C, the fourth magnetic sector 211D and the fifth magnetic sector 211E towards the third optical axis OA3. The electrons of the primary particle beam exit the beam deflection device 210, being guided along the third optical axis OA3 to the object 225 to be examined. On its way to the object 225, the primary particle beam passes a fifth electrostatic lens 218, a beam guiding tube 220, a fifth multipole unit 218A, a sixth multipole unit 218B and an objective lens 221. The fifth electrostatic lens 218 is an electrostatic immersion lens. The primary particle beam is decelerated or accelerated by the fifth electrostatic lens 218 to the electrical potential of the beam guiding tube 220.

The primary particle beam is focused by the objective lens 221 in a focal plane in which the object 225 is positioned. The object 225 is arranged on a movable sample stage 224. The movable sample stage 224 is arranged in an object chamber 226 of the particle beam device 200.

The objective lens 221 may be implemented as a combination of a magnetic lens 222 and a sixth electrostatic lens 223. The end of the beam guiding tube 220 may be one electrode of an electrostatic lens. Particles of the primary particle beam, after exiting from the beam guiding tube 220, are decelerated to the potential of the object 225 arranged on the sample stage 224. The objective lens 221 is not restricted to a combination of the magnetic lens 222 and the sixth electrostatic lens 223. Instead, the objective lens 221 may be implemented in any suitable form. In particular, the objective lens 221 may also be just a mere magnetic lens or just a mere electrostatic lens.

The primary particle beam focused on the object 225 interacts with the object 225. Interaction particles and interaction radiation are generated. In particular, secondary electrons are emitted by the object 225 and backscattered electrons are returned from the object 225. The secondary electrons and the backscattered electrons are again accelerated and are guided into the beam guiding tube 220 along the third optical axis OA3. In particular, the secondary electrons and backscattered electrons travel on the beam path of the primary particle beam in the opposite direction of the primary particle beam.

The particle beam device 200 comprises a first detector 219 which is arranged along the beam path between the beam deflection device 210 and the objective lens 221. Secondary electrons which are guided in directions oriented at large angles with respect to the third optical axis OA3 are detected by the first detector 219. However, backscattered electrons and secondary electrons which are guided in directions having a small axial distance with respect to the third optical axis OA3 at the first detector 219, i.e. backscattered electrons and secondary electrons having a small distance from the third optical axis OA3 at the position of the first detector 219, enter the beam deflection device 210 and are deflected by the fifth magnetic sector 211E, the sixth magnetic sector 211F and the seventh magnetic sector 211G along a detection beam path 227 to a second detector 228 of an analysis unit 231. The total deflection angle may be, for example, 90° or 110°.

The first detector 219 generates detection signals mostly based on the emitted secondary electrons. The second detector 228 of the analysis unit 231 generates detection signals mostly based on backscattered electrons. The detection signals generated by the first detector 219 and the second detector 228 are transmitted to a control unit 700 and are used to obtain information about the properties of the interaction area of the focused primary particle beam with the object 225. If the focused primary particle beam is scanned over the object 225 using a scanning device 229, and if the control unit 700 acquires and stores the detection signals generated by the first detector 219 and the second detector 228, an image of the scanned area of the object 225 can be acquired and displayed by the control unit 700 or a monitor (not shown).

A filter electrode 230 may be arranged in front of the second detector 228 of the analysis unit 231. The filter electrode 230 may be used to separate the secondary electrons from the backscattered electrons due to the kinetic energy difference between the secondary electrons and the backscattered electrons.

In addition to the first detector 219 and the second detector 228, the particle beam device 200 also has a radiation detector 500 which is arranged in the object chamber 226. The radiation detector 500 is positioned at the side of the object 225 and is directed to the object 225. The radiation detector 500 may be a CCD-detector and detects interaction radiation arising from the interaction of the primary particle beam with the object 225, in particular X-rays and/or cathodoluminescence light.

The object chamber 226 is operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor 600 is arranged in the object chamber 226 for measuring the pressure in the object chamber 226. A vacuum system in the form of a pump system 601 being connected to the pressure sensor 600 and being arranged at the object chamber 226 provides for the pressure range in the object chamber 226, either the first pressure range or the second pressure range.

The first detector 219, the second detector 228 of the analysis unit 231 and the radiation detector 500 are connected to the control unit 700. The control unit 700 comprises a processor 701 into which a computer program product comprising a program code is loaded, which, when being executed, controls the particle beam device 200 in such a way that a method according to the system described herein is carried out. This will be explained further below.

Figure 3:
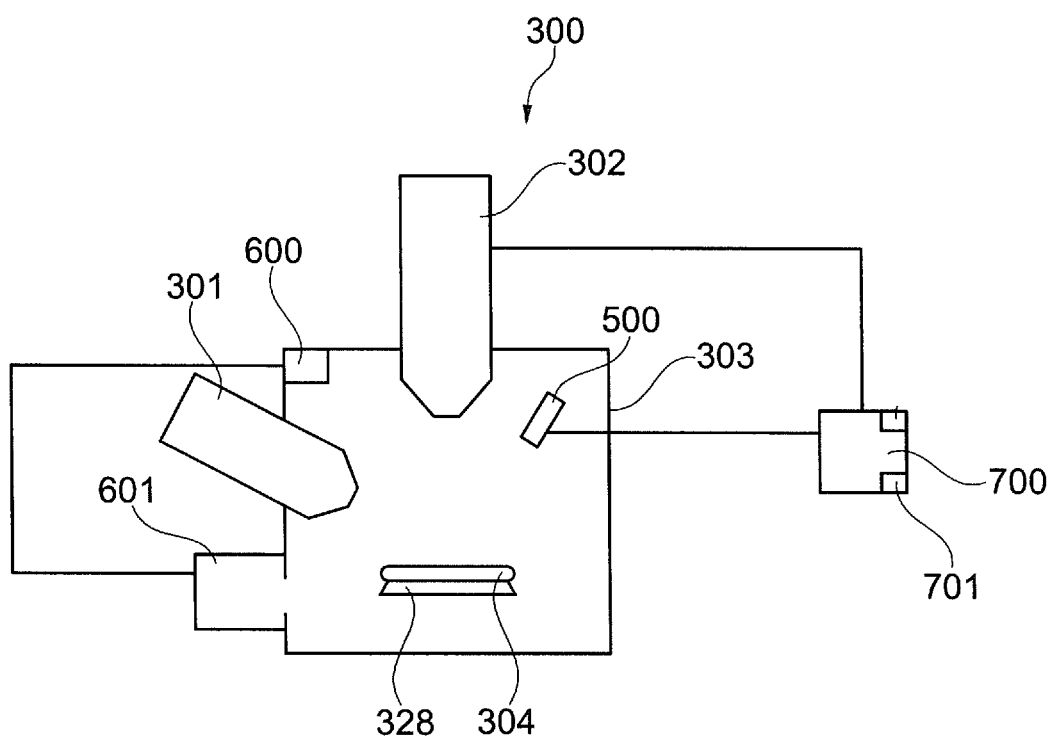
FIG. 3 shows a schematic representation of a fourth embodiment of a particle beam device.

FIG. 3 shows a schematic illustration of another embodiment of a particle beam device 300 according to the system described herein. The particle beam device 300 has a first particle beam column 301 in the form of an ion beam column, and a second particle beam column 302 in the form of an electron beam column. The first particle beam column 301 and the second particle beam column 302 are arranged on an object chamber 303, in which an object 304 to be imaged, analyzed and/or processed is arranged. It is explicitly noted that the system described herein is not restricted to the first particle beam column 301 being in the form of an ion beam column and the second particle beam column 302 being in the form of an electron beam column. In fact, the system described herein also provides for the first particle beam column 301 to be in the form of an electron beam column and for the second particle beam column 302 to be in the form of an ion beam column. A further embodiment of the system described herein provides for both the first particle beam column 301 and the second particle beam column 302 each to be in the form of an ion beam column.

Figure 4:
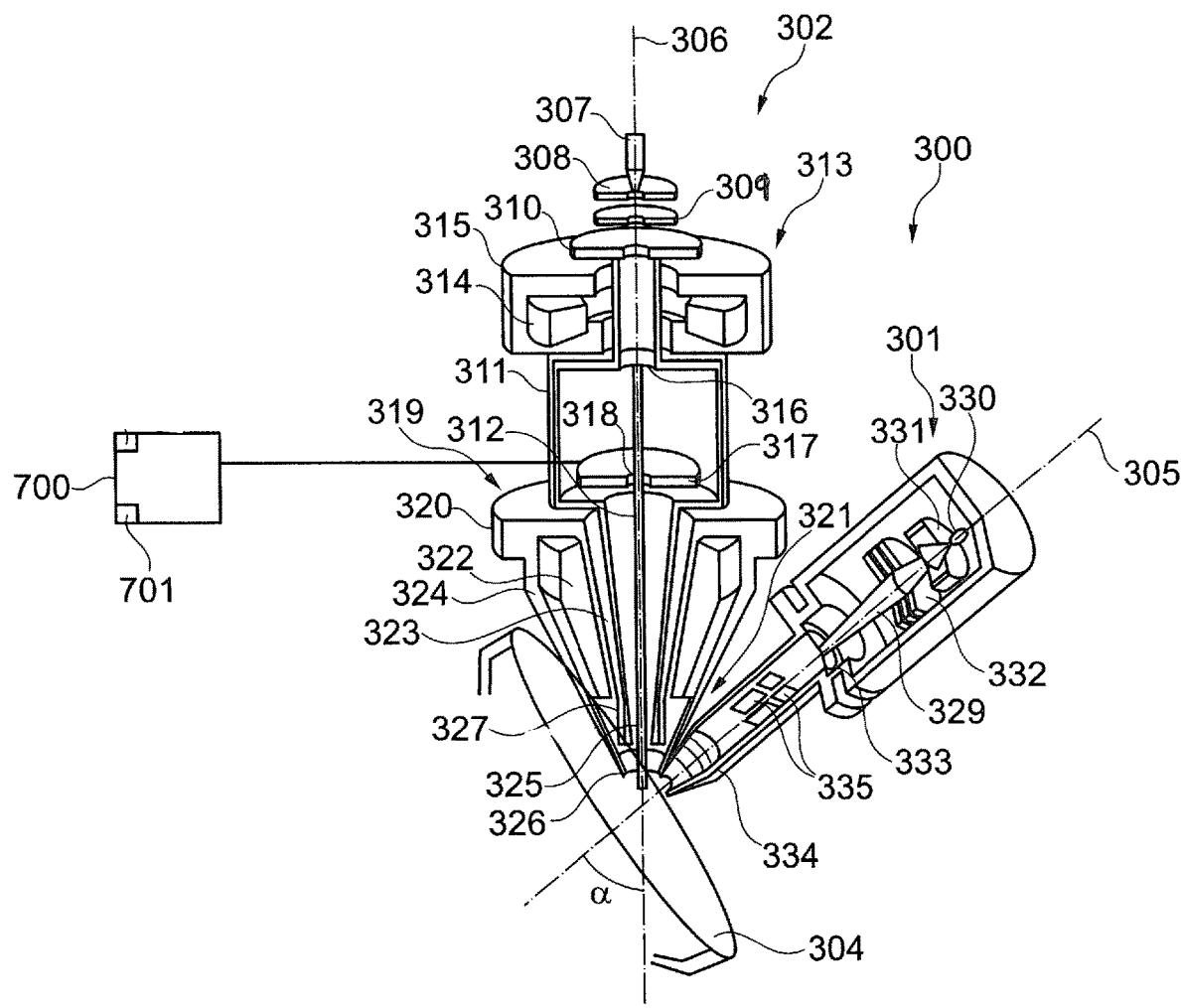
FIG. 4 shows a further schematic representation of the particle beam device according to FIG. 3.

FIG. 4 shows a detailed illustration of the particle beam device 300 shown in FIG. 3. For clarity reasons, the object chamber 303 is not illustrated. The first particle beam column 301 in the form of the ion beam column has a first optical axis 305. Furthermore, the second particle beam column 302 in the form of the electron beam column has a second optical axis 306.

The second particle beam column 302, in the form of the electron beam column, will be described next. The second particle beam column 302 has a second beam generator 307, a first electrode 308, a second electrode 309 and a third electrode 310. By way of example, the second beam generator 307 is a thermal field emitter. The first electrode 308 has the function of a suppressor electrode, while the second electrode 309 has the function of an extractor electrode. The third electrode 310 is an anode, and at the same time forms one end of a beam guide tube 311.

A second particle beam 312 in the form of an electron beam is generated by the second beam generator 307. Electrons which emerge from the second beam generator 307 are accelerated to the anode potential, for example in the range from 1 kV to 30 kV, as a result of a potential difference between the second beam generator 307 and the third electrode 310. The second particle beam 312 in the form of the electron beam passes through the beam guide tube 311, and is focused onto the object 304.

The beam guide tube 311 passes through a collimator arrangement 313 which has a first annular coil 314 and a yoke 315. Seen in the direction of the object 304, from the second beam generator 307, the collimator arrangement 313 is followed by a pinhole diaphragm 316 and a detector 317 with a central opening 318 arranged along the second optical axis 306 in the beam guide tube 311.

The beam guide tube 311 then runs through a hole in a second objective lens 319. The second objective lens 319 is used for focusing the second particle beam 312 onto the object 304. For this purpose, the second objective lens 319 has a magnetic lens 320 and an electrostatic lens 321. The magnetic lens 320 is provided with a second annular coil 322, an inner pole piece 323 and an outer pole piece 324. The electrostatic lens 321 comprises an end 325 of the beam guide tube 311 and a terminating electrode 326.

The end 325 of the beam guide tube 311 and the terminating electrode 326 concurrently form an electrostatic deceleration device. The end 325 of the beam guide tube 311, together with the beam guide tube 311, is at the anode potential, while the terminating electrode 326 and the object 304 are at a potential which is lower than the anode potential. This allows the electrons of the second particle beam 312 to be decelerated to a desired energy which is required for examination of the object 304.

The second particle beam column 302 furthermore has a raster device 327, by which the second particle beam 312 can be deflected and can be scanned in the form of a raster over the object 304.

For imaging purposes, the detector 317 which is arranged in the beam guide tube 311 detects secondary electrons and/or backscattered electrons, which result from the interaction between the second particle beam 312 and the object 304. The signals generated by the detector 317 are transmitted to a control unit 700.

Interaction radiation, for example X-rays or cathodoluminescence light, may be detected by using a radiation detector 500, for example a CCD-detector, which is arranged in the object chamber 303 (see FIG. 3). The radiation detector 500 is positioned at the side of the object 304 and is directed to the object 304.

The object 304 is arranged on an object holder 328 in the form of a sample stage as shown in FIG. 3, by which the object 304 is arranged such that it can move along three axes which are arranged to be mutually perpendicular (specifically an x-axis, a y-axis and a z-axis). Furthermore, the sample stage can be rotated about two rotation axes which are arranged to be mutually perpendicular. It is therefore possible to move the object 304 to a desired position. The rotation of the object holder 328 about one of the two rotation axes may be used to tilt the object holder 328 such that the surface of the object 304 may be oriented perpendicular to the second particle beam 312 or to the first particle beam 329, which will be described further below. Alternatively, the surface of the object 304 may be oriented in such a way that the surface of the object 304, on one hand, and the first particle beam 329 or the second particle beam 312, on the other hand, are at an angle, for example in the range of 0° to 90°.

As mentioned previously, reference symbol 301 denotes the first particle beam column, in the form of the ion beam column. The first particle beam column 301 has a first beam generator 330 in the form of an ion source. The first beam generator 330 is used for generating the first particle beam 329 in the form of an ion beam. Furthermore, the first particle beam column 301 is provided with an extraction electrode 331 and a collimator 332. The collimator 332 is followed by a variable aperture 333 in the direction of the object 304 along the first optical axis 305. The first particle beam 329 is focused onto the object 304 by a first objective lens 334 in the form of focusing lenses. Raster electrodes 335 are provided, in order to scan the first particle beam 329 over the object 304 in the form of a raster.

When the first particle beam 329 strikes the object 304, the first particle beam 329 interacts with the material of the object 304. In the process, interaction radiation is generated and detected using the radiation detector 500. Interaction particles are generated, in particular secondary electrons and/or secondary ions. These are detected using the detector 317.

The object chamber 303 is operated in a first pressure range or in a second pressure range, wherein the first pressure range only comprises pressures lower than or equal to $10^{-3}$ hPa and wherein the second pressure range only comprises pressures over $10^{-3}$ hPa. A pressure sensor 600 is arranged in the object chamber 303 for measuring the pressure in the object chamber 303 (see FIG. 3). A vacuum system in form of a pump system 601 being connected to the pressure sensor 600 and arranged at the object chamber 303 provides for the pressure range in the object chamber 303, either the first pressure range or the second pressure range.

The first particle beam 329 may also be used to process the object 304. For example, material may be deposited on the surface of the object 304 using the first particle beam 329, wherein the material is provided with a gas injection system (GIS). Additionally or alternatively, structures may be etched into the object 304 using the first particle beam 329. Moreover, the second particle beam 312 may be used to process the object 304, for example by electron beam induced deposition.

The detector 317 and the radiation detector 500 are connected to the control unit 700 as shown in FIGS. 3 and 4. The control unit 700 comprises a processor 701 into which a computer program product comprising a program code is loaded, which, when being executed, controls the particle beam device 300 in such a way that a method according to the system described herein is carried out. This will be explained further below.

Figure 5:
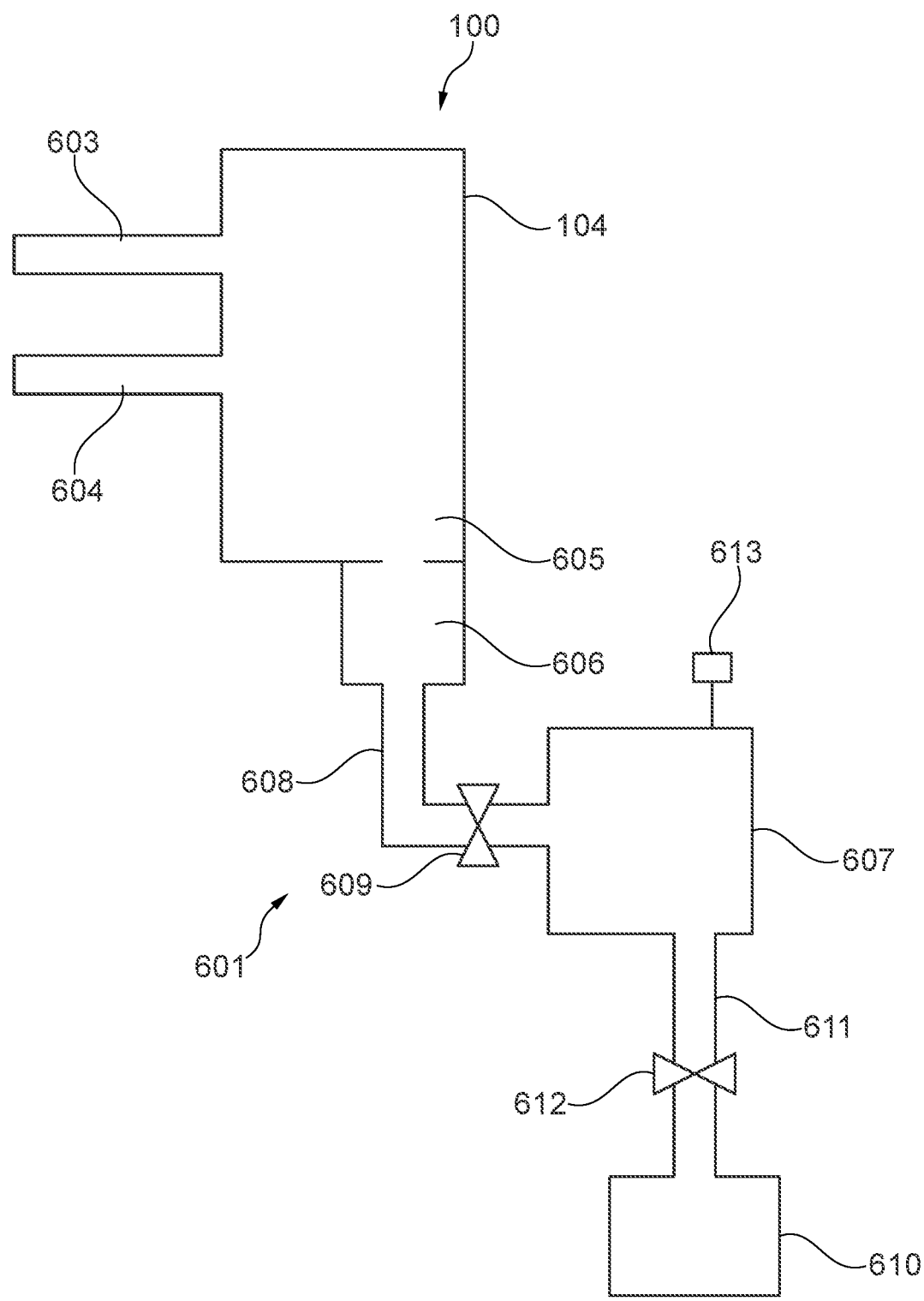
FIG. 5 shows a schematic representation of a vacuum system in the form of a pump system.

A schematic representation of a vacuum system in the form of the pump system 601 is now shown in FIG. 5 with respect to the SEM 100 according to FIG. 1. It is noted that the pump system 601 may be arranged also at the further discussed particle beam devices, namely the SEM 100 of FIG. 1A, the particle beam device 200 of FIG. 2 and the particle beam device 300 of FIGS. 3 and 4.

The SEM 100 comprises the beam guide tube 104, which has a vacuum chamber 605. The vacuum chamber 605 may comprise the electron source 101 for generating the electron beam and/or may comprise the object 114 to be imaged, analyzed and/or processed. Therefore, the vacuum chamber 605 may be the object chamber 120. It is noted that the system described herein is not restricted to the aforementioned vacuum chamber. Rather, any vacuum chamber of the SEM 100 which is suitable for the system described herein may be used for the system described herein.

A first ion getter pump 603 and a second ion getter pump 604 are arranged at the beam guide tube 104 and are in a fluid connection with the vacuum chamber 605. Therefore, the first ion getter pump 603 and the second ion getter pump 604 evacuate the vacuum chamber 605 and provide for a vacuum within the vacuum chamber 605.

A first turbomolecular pump 606 is arranged at the beam guide tube 104 and is in fluid connection with the vacuum chamber 605. Moreover, the first turbomolecular pump 606 is in fluid connection with a first vacuum reservoir 607 via a first conduit 608. A first valve 609 is arranged between the first turbomolecular pump 606 and the first vacuum reservoir 607. The fluid connection between the first turbomolecular pump 606, the vacuum chamber 605 and the first vacuum reservoir 607 may be connected or disconnected using the first valve 609. The first vacuum reservoir 607 is also in fluid connection with a first roughing pump 610 via a second conduit 611. A second valve 612 is arranged between the first vacuum reservoir 607 and the first roughing pump 610. The fluid connection between the first vacuum reservoir 607 and the first roughing pump 610 may be connected or disconnected using the second valve 612. A first pressure measuring unit 613 is arranged at the first vacuum reservoir 607 for measuring a first vacuum reservoir pressure within the first vacuum reservoir 607.

Figure 5A:
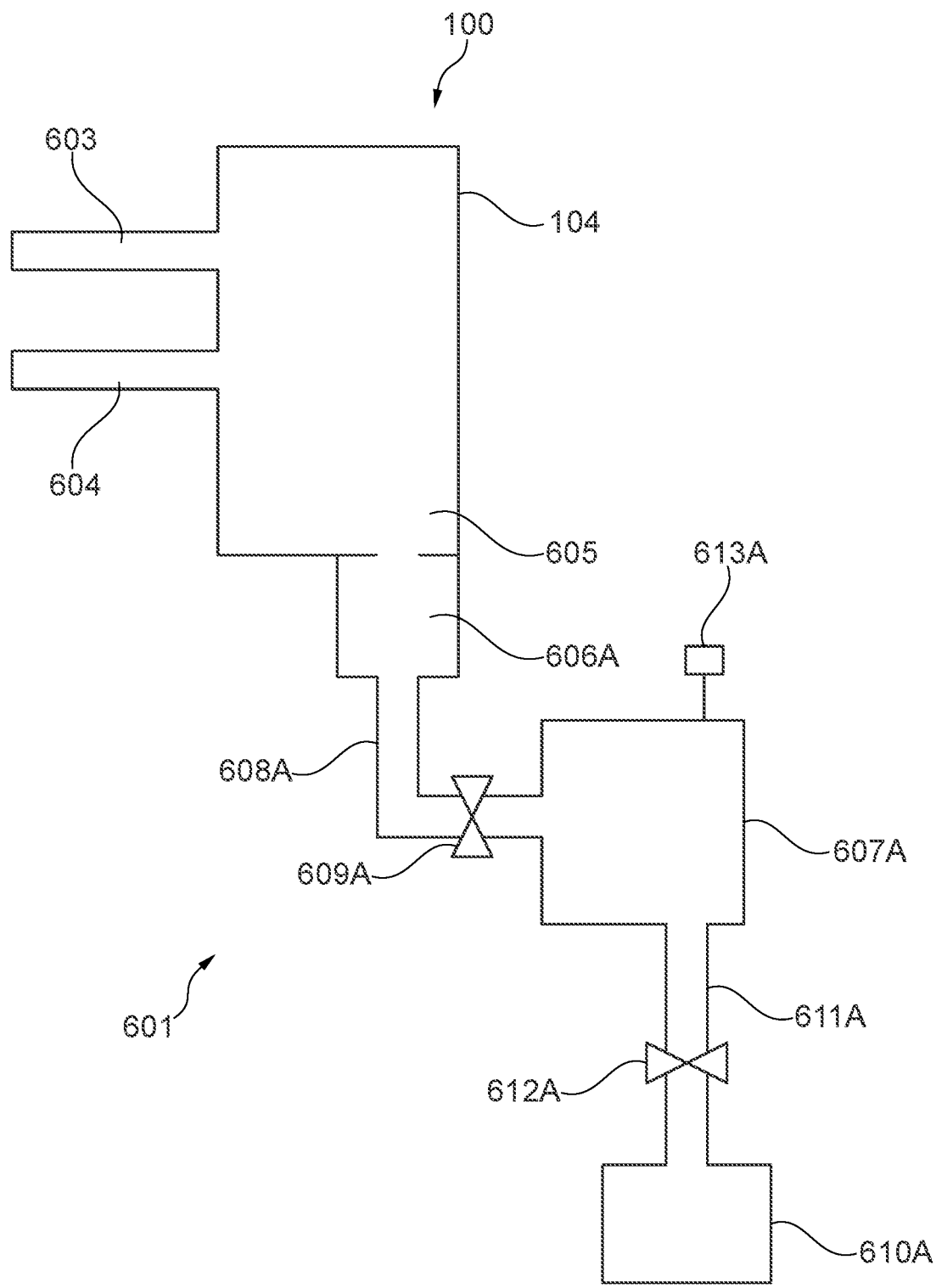
FIG. 5A shows a further schematic representation of the vacuum system in the form of the pump system according to FIG. 5.

A further schematic representation of the vacuum system in the form of the pump system 601 is now shown in FIG. 5A with respect to the SEM 100 according to FIG. 1. As shown in FIG. 5A, the pump system 601 may comprise more than one pump and/or more than one vacuum reservoir. More precisely, the embodiment of the pump system 601 shown in FIGS. 5 and 5A comprises a second turbomolecular pump 606A which is arranged at the beam guide tube 104 and which is in fluid connection with the vacuum chamber 605. Moreover, the second turbomolecular pump 606A is in fluid connection with a second vacuum reservoir 607A via a third conduit 608A. A third valve 609A is arranged between the second turbomolecular pump 606A and the second vacuum reservoir 607A. The fluid connection between the second turbomolecular pump 606A, the vacuum chamber 605 and the second vacuum reservoir 607A may be connected or disconnected using the third valve 609A. The second vacuum reservoir 607A is in fluid connection with a second roughing pump 610A via a fourth conduit 611A. A fourth valve 612A is arranged between the second vacuum reservoir 607A and the second roughing pump 610A. The fluid connection between the second vacuum reservoir 607A and the second roughing pump 610A may be connected or disconnected using the fourth valve 612A. A second pressure measuring unit 613A is arranged at the second vacuum reservoir 607A for measuring a second vacuum reservoir pressure within the second vacuum reservoir 607A.

The pump system 601 may be operated using circles. More precisely, the pump system 601 may be operated using a first pump circle and using a second pump circle.

The first pump circle is described hereinafter. The first roughing pump 610 is used for establishing a vacuum with a low first vacuum reservoir pressure existing in the first vacuum reservoir 607. The low first vacuum reservoir pressure may be equal to or higher than $10^{-3}$ hPa. When the first vacuum reservoir pressure reaches a low threshold, for example $2 \cdot 10^{-3}$ hPa, the first roughing pump 610 is disconnected from the first vacuum reservoir 607. In other words, the second valve 612 is closed such that the fluid connection between the first vacuum reservoir 607 and the first roughing pump 610 is disrupted. Moreover, the first vacuum reservoir 607 is connected to the vacuum chamber 605 and the first turbomolecular pump 606. In other words, the fluid connection between the first vacuum reservoir 607, the vacuum chamber 605 and the first turbomolecular pump 606 is established by opening the first valve is 609. When the fluid connection between the vacuum chamber 605, the first turbomolecular pump 606 and the first vacuum reservoir 607 is established, the first vacuum reservoir pressure existing in the first vacuum reservoir 607 increases. When the first vacuum reservoir pressure reaches a given pressure threshold of the first vacuum reservoir pressure, for example $5 \cdot 10^{-3}$ hPa, the first valve 609 is closed such that the fluid connection between the vacuum chamber 605, the first turbomolecular pump 606 and the first vacuum reservoir 607 is disrupted. The pressure threshold may be given by a user and/or the control unit 701 of the SEM 100. The first roughing pump 610 is connected again to the first vacuum reservoir 607 by opening the second valve 612. The first vacuum reservoir 607 is evacuated using the first roughing pump 610 until the first vacuum reservoir pressure reaches the low threshold again. When the low threshold is reached, the first pump circle starts over again.

The second pump circle is described hereinafter. The second roughing pump 610A is used for establishing a vacuum with a low second vacuum reservoir pressure existing in the second vacuum reservoir 607A. The low second vacuum reservoir pressure may be equal to or higher than $10^{-3}$ hPa. When the second vacuum reservoir pressure reaches a low threshold, for example $2 \cdot 10^{-3}$ hPa, the second roughing pump 610A is disconnected from the second vacuum reservoir 607A. In other words, the fourth valve 612A is closed such that the fluid connection between the second vacuum reservoir 607A and the second roughing pump 610A is disrupted. Moreover, the second vacuum reservoir 607A is connected to the vacuum chamber 605 and the second turbomolecular pump 606A. In other words, the fluid connection between the second vacuum reservoir 607A, the vacuum chamber 605 and the second turbomolecular pump 606A is established by opening the third valve 609A. When the fluid connection between the vacuum chamber 605, the second turbomolecular pump 606A and the second vacuum reservoir 607A is established, the second vacuum reservoir pressure existing in the second vacuum reservoir 607A increases. When the second vacuum reservoir pressure of the second vacuum reservoir 607A reaches a given pressure threshold of the second vacuum reservoir pressure, for example $5 \cdot 10^{-3}$ hPa, the third valve 609A is closed such that the fluid connection between the vacuum chamber 605, the second turbomolecular pump 606A and the second vacuum reservoir 607A is disrupted. The pressure threshold may be given by the user and/or the control unit 701 of the SEM 100. The second roughing pump 610A is connected again to the second vacuum reservoir 607A by opening the fourth valve 612A. The second vacuum reservoir 607A is evacuated using the second roughing pump 610A until the second vacuum reservoir pressure reaches the low threshold again. When the low threshold is reached, the second pump circle starts over again.

The opening and the closing of the first valve 609, the second valve 612, the third valve 609A and the fourth valve 612A may cause disturbances to the SEM 100. These disturbances are vibrations. Moreover, the vibrations may be caused by evacuating the first vacuum reservoir 607 and the second vacuum reservoir 607A. If the object 114 is imaged, analyzed and/or processed during the disturbances, the obtained image of the object 114, for example, may be of insufficient quality and, therefore, in particular imaging of the object 114 has to be repeated for obtaining a good quality image of the object 114. An embodiment of the method according to the system described herein avoiding this disadvantage will now be explained. The method according to the system described herein is carried out using the SEM 100 according to FIG. 1. It is noted that the method may also be carried out with other particle beam devices, in particular the SEM 100 of FIG. 1A, the particle beam device 200 of FIG. 2 and the particle beam device 300 of FIGS. 3 and 4.

Figure 6:
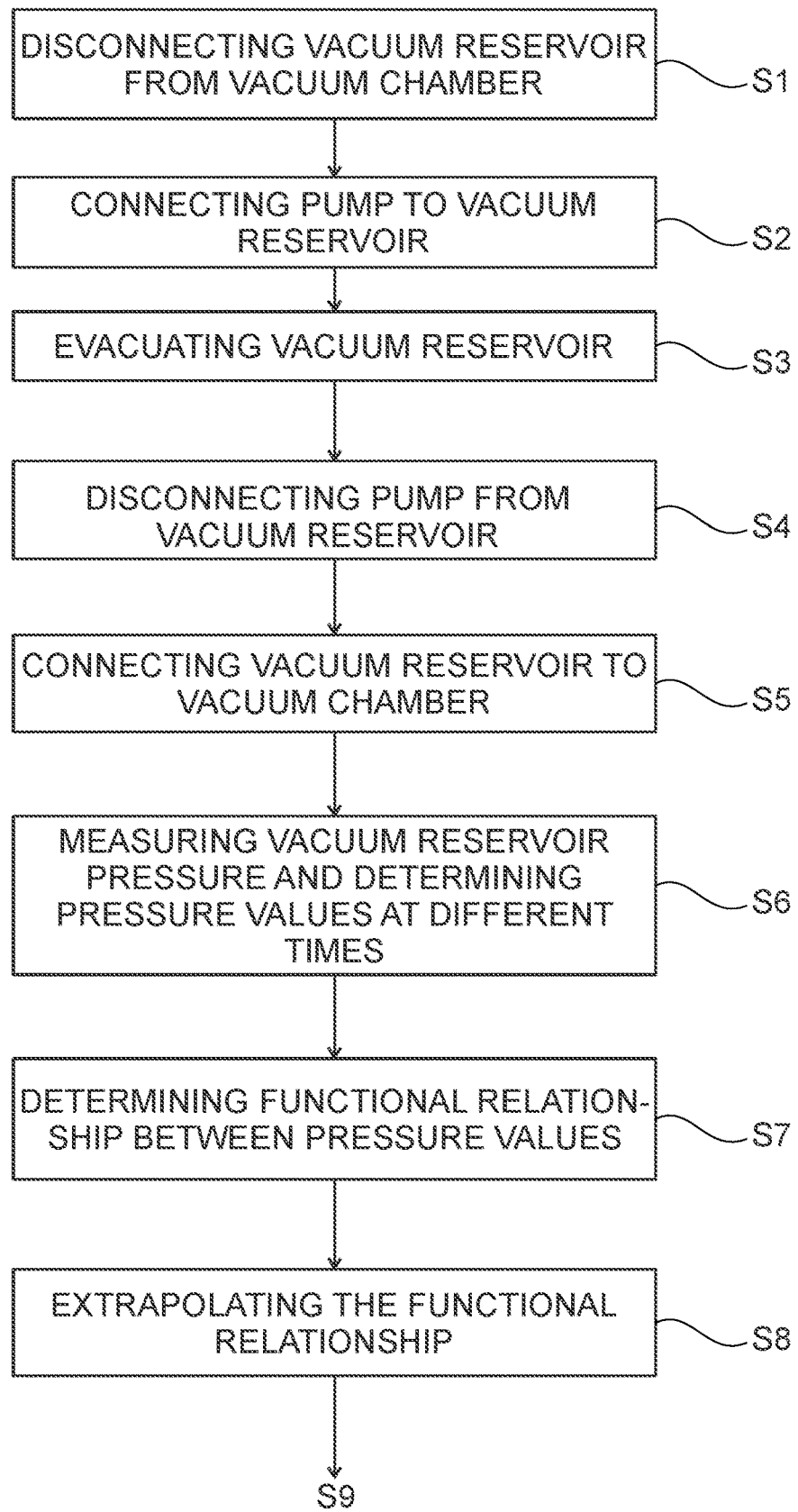
FIG. 6 shows a flow chart of an embodiment of a method for operating a vacuum system.
Figure 6A:
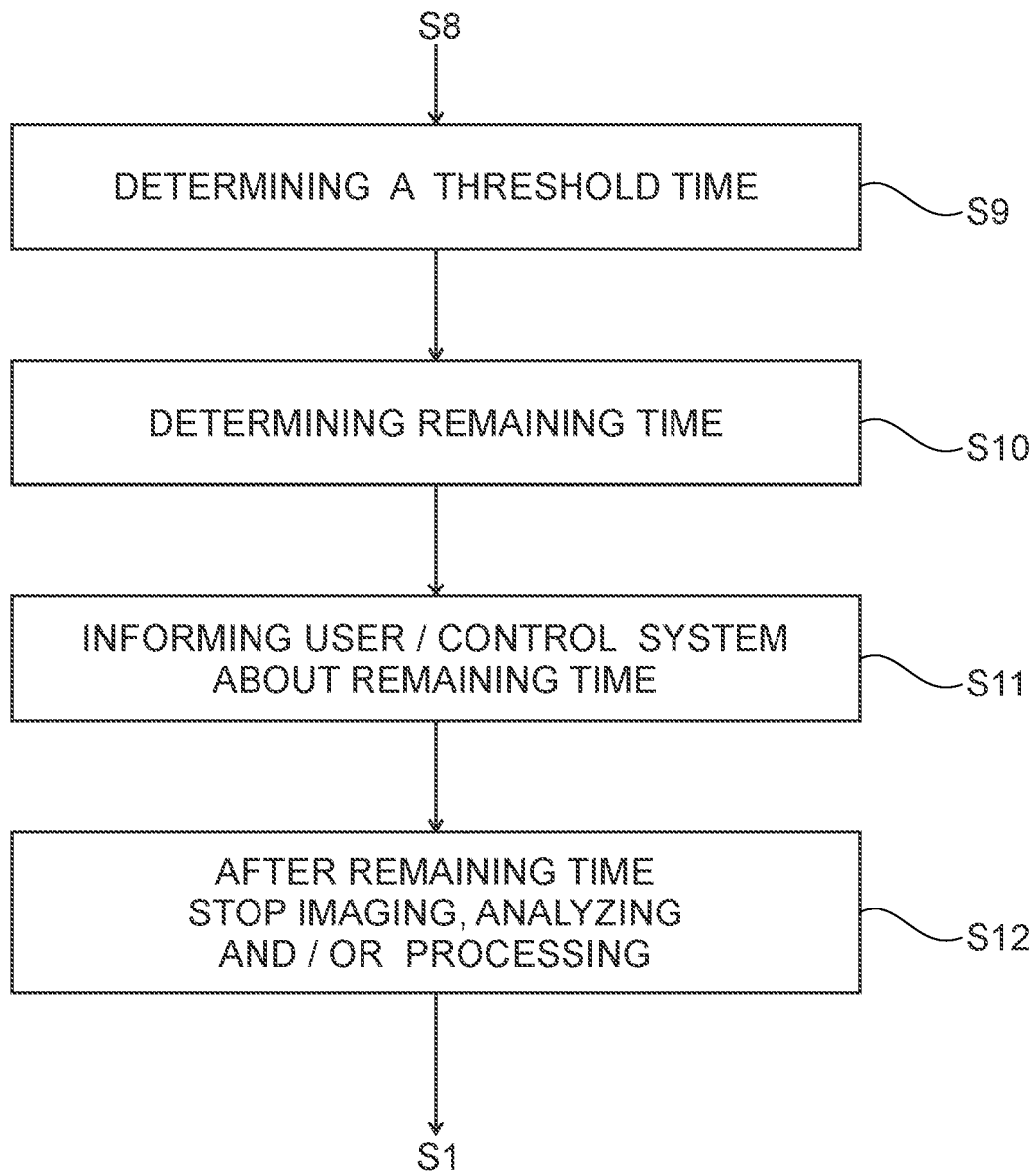
FIG. 6A shows a further flow chart of the embodiment of the method for operating a vacuum system according to FIG. 6.

FIGS. 6 and 6A show the embodiment of the method according to the system described herein. The method will be explained with respect to the first vacuum reservoir 607. In method step S1, the first vacuum reservoir 607 is disconnected from the vacuum chamber 605 and the first turbomolecular pump 606 by closing the first valve 609. In method step S2, the first roughing pump 610 is connected to the first vacuum reservoir 607 by opening the second valve 612. In method step S3, the first vacuum reservoir 607 is evacuated by the first roughing pump 610. As mentioned above, the first roughing pump 610 is used for establishing a vacuum with a low first vacuum reservoir pressure existing in the first vacuum reservoir 607. The low first vacuum reservoir pressure may be equal to or higher than $10^{-3}$ hPa. When the first vacuum reservoir pressure reaches a low threshold, for example $2 \cdot 10^{-3}$ hPa, the first roughing pump 610 is disconnected from the first vacuum reservoir 607 in method step S4. In other words, the second valve 612 is closed such that the fluid connection between the first vacuum reservoir 607 and the first roughing pump 612 is disrupted.

In method step S5, the first vacuum reservoir 607 is connected to the vacuum chamber 605 and to the first turbomolecular pump 606. In other words, the fluid connection between the first vacuum reservoir 607, the vacuum chamber 605 and the first turbomolecular pump 606 is established by opening the first valve 609. Moreover, imaging, analyzing and/or processing the object 114 using the SEM 100 is started in method step S5.

As mentioned above, the first vacuum reservoir pressure existing in the first vacuum reservoir 607 increases after the fluid connection between the vacuum chamber 605, the first turbomolecular pump 606 and the first vacuum reservoir 607 is established. Therefore, in method step S6, the first vacuum reservoir pressure is measured using the first pressure measuring unit 613. Pressure values of the first vacuum reservoir pressure are determined at different times. More precisely, at least one first pressure value of the first vacuum reservoir pressure at a first time T1 and at least a second pressure value of the first vacuum reservoir pressure at a second time T2 are determined, wherein T2 is later than T1. In other embodiments, the method comprises determining more than two pressure values of the first vacuum reservoir pressure, in particular 5, 10, 15, 20 or up to 100 pressure values of the first vacuum reservoir pressure, wherein each pressure value of the first vacuum reservoir pressure is determined at a different time.

Figure 7:
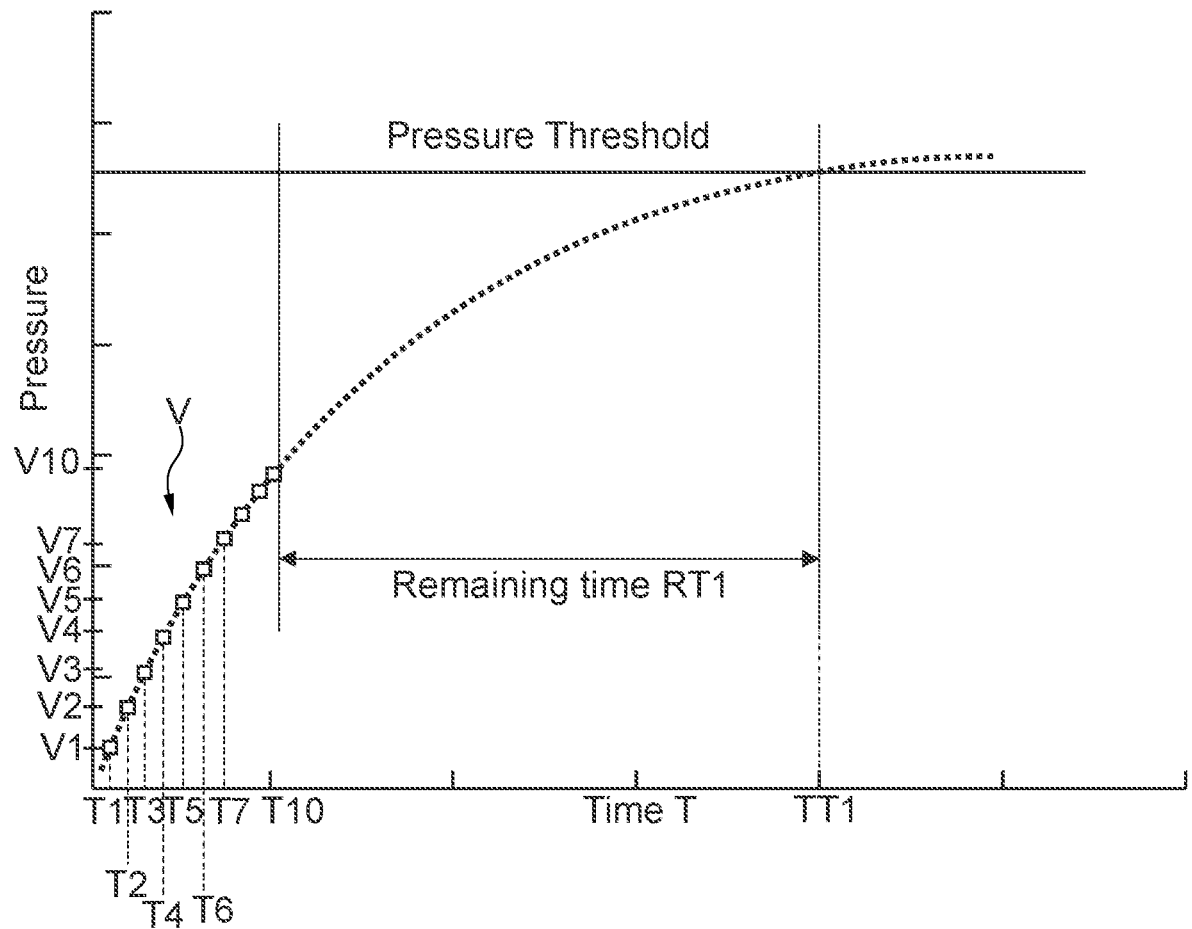
FIG. 7 shows a schematic representation of a vacuum reservoir pressure existing in a vacuum reservoir as dependent on time.

FIG. 7 shows a schematic representation of the first vacuum reservoir pressure existing in the first vacuum reservoir 607 as dependent on time. 10 pressure values of the first vacuum reservoir pressure were determined at different times. More precisely, a first pressure value V1 of the first vacuum reservoir pressure at a first time T1, a second pressure value V2 of the first vacuum reservoir pressure at a second time T2, a third pressure value V3 of the first vacuum reservoir pressure at a third time T3, a fourth pressure value V4 of the first vacuum reservoir pressure at a fourth time T4, a fifth pressure value V5 of the first vacuum reservoir pressure at a fifth time T5, a sixth pressure value V6 of the first vacuum reservoir pressure at a sixth time T6, a seventh pressure value V7 of the first vacuum reservoir pressure at a seventh time T7, an eighth pressure value V8 of the first vacuum reservoir pressure at an eighth time T8, a ninth pressure value V9 of the first vacuum reservoir pressure at a ninth time T9 and a tenth pressure value V10 of the first vacuum reservoir pressure at a tenth time T10 are determined. For reasons of clarity, only the first time T1 to the seventh time T7 and the tenth time T10 are denoted in FIG. 7. Moreover, the pressure values V1 to V10 are denoted altogether by the letter V.

In method step S7, the pressure values V1 to V10 are used for determining a first functional relationship between the pressure values V1 to V10. The first functional relationship is a first function of time. The first functional relationship may be a linear relationship or a nonlinear relationship. A step function may also be comprised by the first functional relationship or form the first functional relationship. The first functional relationship may be determined by different methods. By way of example, the first functional relationship may be determined by an interpolation. Any suitable interpolation method, for example a linear interpolation, a nonlinear interpolation, a trigonometric interpolation, a logarithmic interpolation and/or a spline interpolation, may be used in the interpolation. In addition and/or as an alternative thereto, functional relationship may be determined by extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the first functional relationship may be determined by forming an average, ascertaining random values and/or determining the smallest value or the largest value from the set of the pressure values V1 to V10.

The determined first functional relationship may be the following function:

$$p(t) = p_0 + h \cdot \left(1 - \exp\left(-\frac{t}{t_0}\right)\right)$$

wherein $p_0$ is the first vacuum reservoir pressure of the first vacuum reservoir 607 at an initial time $t_0$ and wherein h is a specifiable constant. The variables $p_0$, $t_0$ and h may be fitting parameters for determining the first functional relationship.

In method step S8, the determined first functional relationship will be extrapolated for times later than the latest time at which a pressure value of the first vacuum reservoir pressure of the first vacuum reservoir 607 has been measured. In the embodiment shown in FIG. 7, the tenth time T10 is the latest time. Therefore, the determined first functional relationship is extrapolated for times T later than T10. By extrapolating the first functional relationship, it is determined how the first vacuum reservoir pressure of the first vacuum reservoir 607 increases or decreases after the tenth time T10.

In a further method step S9, a first threshold time TT1 is determined using the extrapolated function (see FIG. 7). The first threshold time TT1 is a time when the extrapolated functional relationship reaches a pressure threshold given for the first vacuum reservoir pressure of the first vacuum reservoir 607. The pressure threshold may be given by the user and/or the control system 701 of the SEM 100. For example, the pressure threshold is $5 \cdot 10^{-3}$ hPa. The pressure threshold is a pressure value which should not be exceeded; otherwise the vacuum in the vacuum chamber 605 and/or in the first vacuum reservoir 607 is not sufficient anymore for providing for a good imaging of the object 114, for example.

In a further method step S10, a first remaining time period RT1 is determined. The first remaining time period RT1 is the time elapsing until the first vacuum reservoir pressure of the first vacuum reservoir 607 reaches the pressure threshold. The first remaining time period RT1 is a time difference between the first threshold time TT1 and the latest time at which a pressure value of the first vacuum reservoir pressure of the first vacuum reservoir 607 has been measured. In the embodiment of FIG. 7, the tenth time T10 is the latest time. In other words, the first remaining time period RT1 corresponds to the time which is left until the first vacuum reservoir pressure of the first vacuum reservoir 607 reaches the pressure threshold.

In a further method step S11, the user and/or the control system 701 of the SEM 100 are informed about the first remaining time period RT1. In particular, the first remaining time period RT1 may be displayed to the user.

In a further method step S12, imaging, analyzing and/or processing the object 114 are/is stopped when reaching the first threshold time TT1 and after the first remaining time period RT1. This way, no imaging, analyzing and/or processing the object 114 is carried out during the disturbances caused by the above-mentioned first valve 609, the second valve 612 and by the first roughing pump 610. After method step S12, the method according to the system described herein may start from method step S1 again. Therefore, the method according to the system described herein may be a circle method.

The embodiment of the method according to the system described herein shown in FIGS. 6, 6A and 7 may also be carried out analogously with respect to the further parts of the pump system 601, namely the second turbomolecular pump 606A, the second vacuum reservoir 607A and the second roughing pump 610A. A second remaining time period RT2 is determined with respect to this embodiment.

Figure 8:
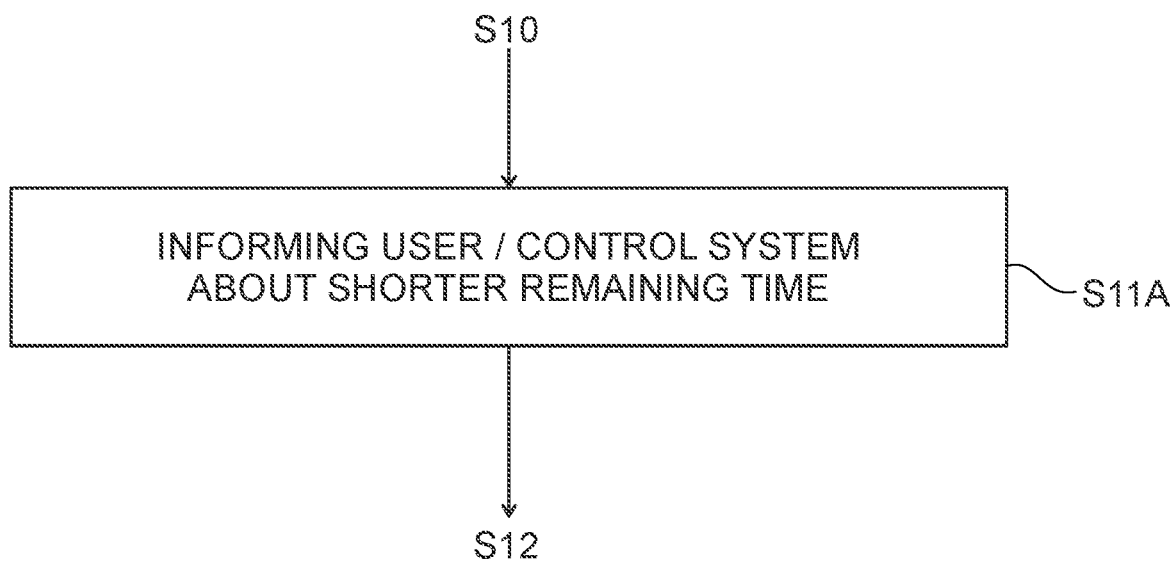
FIG. 8 shows a flow chart of a further embodiment of a method for operating a vacuum system.

FIG. 8 shows a further embodiment of the method according to the system described herein. The embodiment of the method of FIG. 8 is based on the embodiment of the method shown in FIGS. 6, 6A and 7. Therefore, the embodiment of FIG. 8 comprises the method steps as mentioned above. However, the embodiment of the method shown in FIG. 8 comprises a method step S11A instead of method step S11. Method step S11A is carried out between the method steps S10 and S12. The embodiment of the method shown in FIG. 8 is carried out if the SEM 100 comprises several vacuum reservoirs. For example, the SEM 100 comprises the first vacuum reservoir 607 and the second vacuum reservoir 607A. As mentioned above, the method steps S1 to S10 are carried out for each of the vacuum reservoirs 607, 607A of the SEM 100. Thus, the first remaining time period RT1 for the first vacuum reservoir 607 and a second remaining time period RT2 for the second vacuum reservoir 607A are determined. In method step S11A, the user and/or the control system 701 of the SEM 100 is/are informed about which one of the first remaining time period RT1 and the second remaining time period RT2 is the shorter remaining time period. Therefore, only one of the first remaining time period RT1 and the second remaining time period RT2 is displayed to the user. Additionally or alternatively, the shorter remaining time period of the first remaining time period RT1 and the second remaining time period RT2 is provided to the user and/or to the control system 701 of the SEM 100 if the time difference between the first remaining time period RT1 and the second remaining time period RT2 is shorter than one minute or two minutes. These two aforementioned embodiments are based on the following thoughts. As mentioned above, the SEM 100 may comprise several vacuum reservoirs. Each of the several vacuum reservoirs may be monitored and the remaining time period for each vacuum reservoir is determined. The user and/or the control system of the SEM 100 is/are informed about the time of the next disturbance which has the smallest value of all the remaining time periods with respect to the several monitored vacuum reservoirs. Moreover, if the disturbances with respect to the several vacuum reservoirs are close together in time, the embodiment of the method combines those disturbances to a single disturbance such that the user and/or the control system 701 of the SEM 100 is/are informed about a single disturbance only with respect to the vacuum reservoirs. The single disturbance corresponds to the shortest remaining time period of the remaining time periods of the monitored vacuum reservoirs being close together in time.

Figure 9:
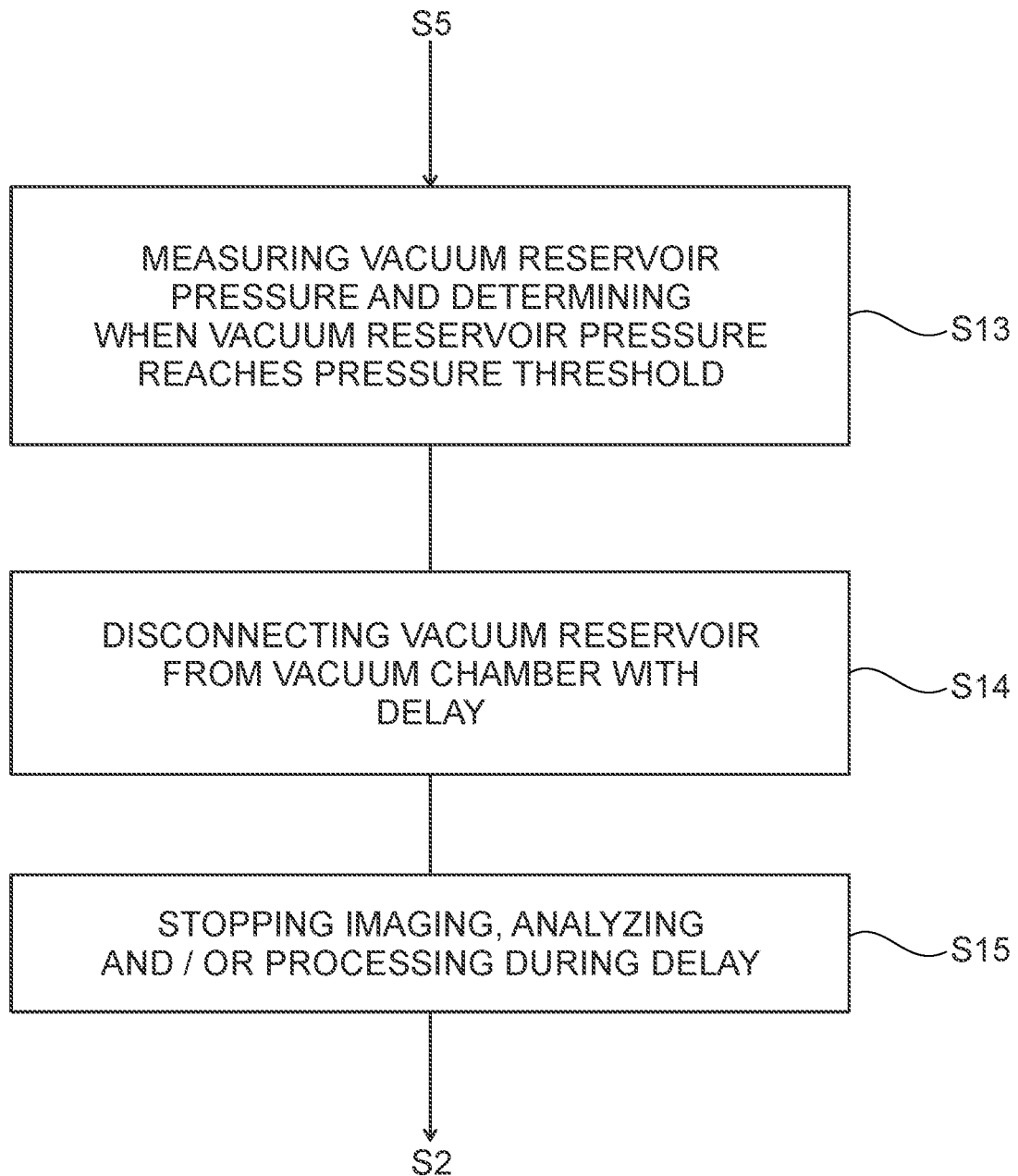
FIG. 9 shows a flow chart of another embodiment of a method for operating a vacuum system.

FIG. 9 shows a further method according to the system described herein. The method of FIG. 9 is now explained with respect to the first vacuum reservoir 607.

The method of FIG. 9 is based on the embodiment of the method shown in FIGS. 6, 6A and 7 and also comprises method steps S1 to S5 as mentioned above. However, method step S13 is carried out after method step S5. In method step S13, the first vacuum reservoir pressure is measured using the first pressure measuring unit 613 for determining when first the vacuum reservoir pressure reaches a first pressure threshold given for the first vacuum reservoir pressure of the first vacuum reservoir 607. The first pressure threshold may be given by the user and/or the control system 701 of the SEM 100. For example, the first pressure threshold is $5 \cdot 10^{-3}$ hPa. The first pressure threshold is a pressure value which should not be exceeded, otherwise the vacuum in the vacuum chamber 605 and/or in the first vacuum reservoir 607 is not sufficient anymore for providing for a good imaging of the object 114, for example.

When the first vacuum reservoir pressure reaches the first pressure threshold and/or exceeds the first pressure threshold, in a further method step S14, the first vacuum reservoir 607 is disconnected from the vacuum chamber 605 with a given delay after the first vacuum reservoir pressure has reached the first pressure threshold. The given delay may be a time period of less than two minutes, less than one minute or less than 30 seconds. For example, the first valve 609 is closed to disrupt the fluid connection between the first vacuum reservoir 607, the vacuum chamber 605 and the first turbomolecular pump 606. In method step 15, imaging, analyzing and/or processing the object 114 using the SEM 100 is stopped during the delay. After method step 15, the further method starts again with method step S2, wherein the first roughing pump 610 is connected to the first vacuum reservoir 607. Imaging, analyzing and/or processing the object 114 is stopped while the roughing pump 610 is connected to the first vacuum reservoir 607.

The further method shown in FIG. 9 has the advantage that the user and/or the control system 701 of the SEM 100 may finish the process of imaging, analyzing and/or processing the object 114 before the disturbances will occur. Therefore, in particular the number of low quality images decreases. Moreover, the further method is also advantageous in particular for imaging large objects or automated processes of imaging an object. Additionally, since the disturbances will not start before specific operations within the SEM 100 have been stopped, damages to the object 114 and/or to parts of the SEM 100 are avoided.

Figure 10:
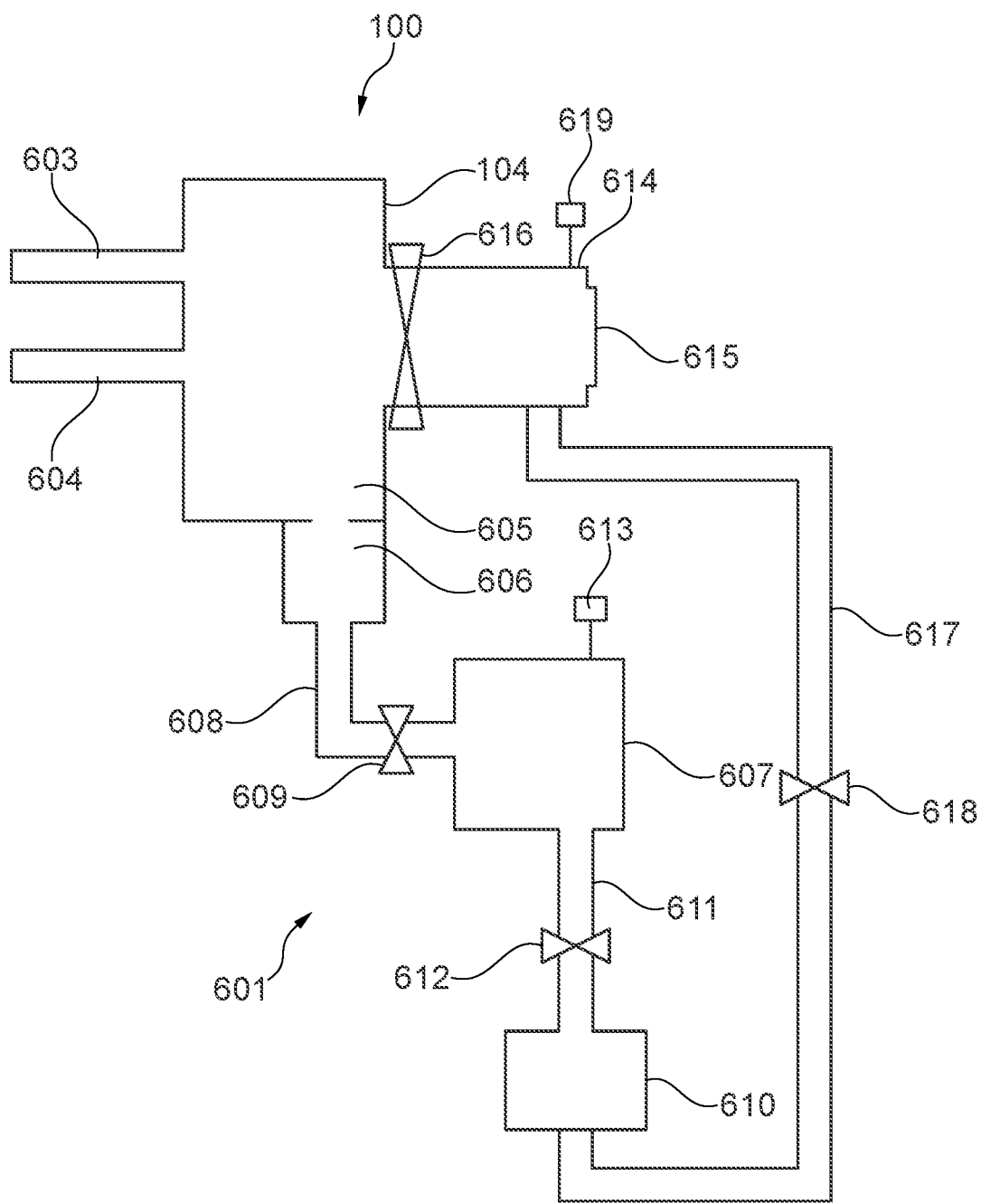
FIG. 10 shows a schematic representation of a further vacuum system in the form of a pump system.

A schematic representation of a further vacuum system in the form of the pump system 601 is shown in FIG. 10 with respect to the SEM 100 according to FIG. 1. The further vacuum system of FIG. 10 is based on the vacuum system of FIG. 5. Identical reference signs denote identical components. Therefore, the further vacuum system of FIG. 10 comprises all features as above mentioned with respect to the vacuum system of FIG. 5. However, in addition to the features of the vacuum system of FIG. 5, the further vacuum system of FIG. 10 comprises a lock chamber 614 which is arranged at the beam guide tube 104. The lock chamber 614 is an exchange chamber of the SEM 100 into which the object 114 is introduced before the object 114 is further introduced into the objet chamber 120 which is the vacuum chamber 605 of FIG. 10. The lock chamber 614 comprises a door 615 which may be opened and closed to introduce the object 114 into the lock chamber 614. Moreover, the lock chamber 614 comprises a lock chamber valve 616 which may be opened or closed to introduce the object 114 into the vacuum chamber 605. The lock chamber 614 is also in fluid connection with the first roughing pump 610 via a lock chamber conduit 617. A lock chamber conduit valve 618 is arranged between the lock chamber 614 and the first roughing pump 610. The fluid connection between the lock chamber 614 and the first roughing pump 610 may be connected or disconnected using the lock chamber conduit valve 618. A lock chamber pressure measuring unit 619 is arranged at the lock chamber 614 for measuring a vacuum reservoir pressure within the lock chamber 614.

The pump circle of the lock chamber 614 is described hereinafter. The pump circle is carried out with the door 615 being closed. The first roughing pump 610 is used for establishing a vacuum with a low vacuum reservoir pressure existing in the lock chamber 614. The low vacuum reservoir pressure may be equal to or higher than $10^{-3}$ hPa. When the vacuum reservoir pressure reaches a low threshold, for example $2 \cdot 10^{-3}$ hPa, the first roughing pump 610 is disconnected from the lock chamber 614. In other words, the lock chamber conduit valve 618 is closed such that the fluid connection between the lock chamber 614 and the first roughing pump 610 is disrupted. Moreover, the lock chamber 614 is connected to the vacuum chamber 605. In other words, the fluid connection between the lock chamber 614 and the vacuum chamber 605 is established by opening the lock chamber valve 616. When the fluid connection between the lock chamber 614 and the vacuum chamber 605 is established, the vacuum reservoir pressure existing in the lock chamber 614 increases. When the vacuum reservoir pressure reaches a given pressure threshold of the vacuum reservoir pressure, for example $5 \cdot 10^{-3}$ hPa, the lock chamber valve 616 is closed such that the fluid connection between the lock chamber 614 and the vacuum chamber 605 is disrupted. The pressure threshold may be given by a user and/or the control unit 701 of the SEM 100. The first roughing pump 610 is connected again to the lock chamber 614 by opening the lock chamber conduit valve 618. The lock chamber 614 is evacuated using the first roughing pump 610 until the vacuum reservoir pressure reaches the low threshold again. When the low threshold is reached, the pump circle starts over again.

The pressure in the lock chamber 614 is controlled and set analogously to the method according to FIGS. 6, 6A and 7. The lock chamber 614 is disconnected from the vacuum chamber 605 by closing the lock chamber valve 616. Furthermore, the first roughing pump 610 is connected to the lock chamber 614 by opening the lock chamber conduit valve 618. The lock chamber 614 is evacuated by the first roughing pump 610. As mentioned above, the first roughing pump 610 is used for establishing a vacuum with a low vacuum reservoir pressure existing in the lock chamber 614. The low vacuum reservoir pressure may be equal to or higher than $10^{-3}$ hPa. When the vacuum reservoir pressure reaches a low threshold, for example $2 \cdot 10^{-3}$ hPa, the first roughing pump 610 is disconnected from the lock chamber 14. In other words, the lock chamber conduit valve 618 is closed such that the fluid connection between the lock chamber 614 and the first roughing pump 610 is disrupted. Moreover, the lock chamber 614 is connected to the vacuum chamber 605. In other words, the fluid connection between the lock chamber 614 and the vacuum chamber 605 is established by opening the lock chamber valve 616.

As mentioned above, the vacuum reservoir pressure existing in the lock chamber 614 increases after the fluid connection between the lock chamber 614 and the vacuum chamber 605 is established. Therefore the vacuum reservoir pressure is measured using the lock chamber pressure measuring unit 619. Pressure values of the vacuum reservoir pressure are determined at different times. More precisely, at least one first pressure value of the vacuum reservoir pressure at a first time T1 and at least a second pressure value of the vacuum reservoir pressure at a second time T2 are determined, wherein T2 is later than T1. In other embodiments, the method comprises determining more than two pressure values of the vacuum reservoir pressure, in particular 5, 10, 15, 20 or up to 100 pressure values of the vacuum reservoir pressure, wherein each pressure value of the first vacuum reservoir pressure is determined at a different time.

FIG. 7 also shows the schematic representation of the vacuum reservoir pressure existing in the lock chamber 614 as dependent on time. 10 pressure values of the vacuum reservoir pressure were determined at different times. More precisely, a first pressure value V1 of the vacuum reservoir pressure at a first time T1, a second pressure value V2 of the vacuum reservoir pressure at a second time T2, a third pressure value V3 of the vacuum reservoir pressure at a third time T3, a fourth pressure value V4 of the vacuum reservoir pressure at a fourth time T4, a fifth pressure value V5 of the vacuum reservoir pressure at a fifth time T5, a sixth pressure value V6 of the vacuum reservoir pressure at a sixth time T6, a seventh pressure value V7 of the vacuum reservoir pressure at a seventh time T7, an eighth pressure value V8 of the vacuum reservoir pressure at an eighth time T8, a ninth pressure value V9 of the vacuum reservoir pressure at a ninth time T9 and a tenth pressure value V10 of the vacuum reservoir pressure at a tenth time T10 are determined. As above mentioned, for reasons of clarity, only the first time T1 to the seventh time T7 and the tenth time T10 are denoted in FIG. 7. Moreover, the pressure values V1 to V10 are denoted altogether by the letter V.

The pressure values V1 to V10 are used for determining a functional relationship between the pressure values V1 to V10. The functional relationship is a function of time. The functional relationship may be a linear relationship or a nonlinear relationship. A step function may also be comprised by the functional relationship or form the functional relationship. The functional relationship may be determined by different methods. By way of example, the functional relationship may be determined by an interpolation. Any suitable interpolation method, for example a linear interpolation, a nonlinear interpolation, a trigonometric interpolation, a logarithmic interpolation and/or a spline interpolation, may be used in the interpolation. In addition and/or as an alternative thereto, functional relationship may be determined by extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the pressure values V1 to V10. The determined functional relationship may be function as already mentioned above.

The determined functional relationship will be extrapolated for times later than the latest time at which a pressure value of the vacuum reservoir pressure of the lock chamber 614 has been measured. In the embodiment shown in FIG. 7, the tenth time T10 is the latest time. Therefore, the determined functional relationship is extrapolated for times T later than T10. By extrapolating the functional relationship, it is determined how the vacuum reservoir pressure of the lock chamber 614 increases or decreases after the tenth time T10.

A first threshold time TT1 is determined using the extrapolated function. The first threshold time TT1 is a time when the extrapolated functional relationship reaches a pressure threshold given for the vacuum reservoir pressure of the lock chamber 614. The pressure threshold may be given by the user and/or the control system 701 of the SEM 100. For example, the pressure threshold is $5 \cdot 10^{-3}$ hPa. The pressure threshold is a pressure value which should not be exceeded; otherwise the vacuum in the vacuum chamber 605 and/or in the lock chamber 614 is not sufficient anymore.

A first remaining time period RT1 is determined. The first remaining time period RT1 is the time elapsing until the vacuum reservoir pressure of the lock chamber 614 reaches the pressure threshold. The first remaining time period RT1 is a time difference between the first threshold time TT1 and the latest time at which a pressure value of the vacuum reservoir pressure of the lock chamber 614 has been measured. In the embodiment of FIG. 7, the tenth time T10 is the latest time. In other words, the first remaining time period RT1 corresponds to the time which is left until the vacuum reservoir pressure of the lock chamber 614 reaches the pressure threshold. The user and/or the control system 701 of the SEM 100 are informed about the first remaining time period RT1. In particular, the first remaining time period RT1 may be displayed to the user. Imaging, analyzing and/or processing the object 114 are/is stopped when reaching the first threshold time TT1 and after the first remaining time period RT1. This way, no imaging, analyzing and/or processing the object 114 is carried out during the disturbances caused by the above-mentioned lock chamber valve 616, by the lock chamber conduit valve 618 and by the first roughing pump 610.

Figure 11:
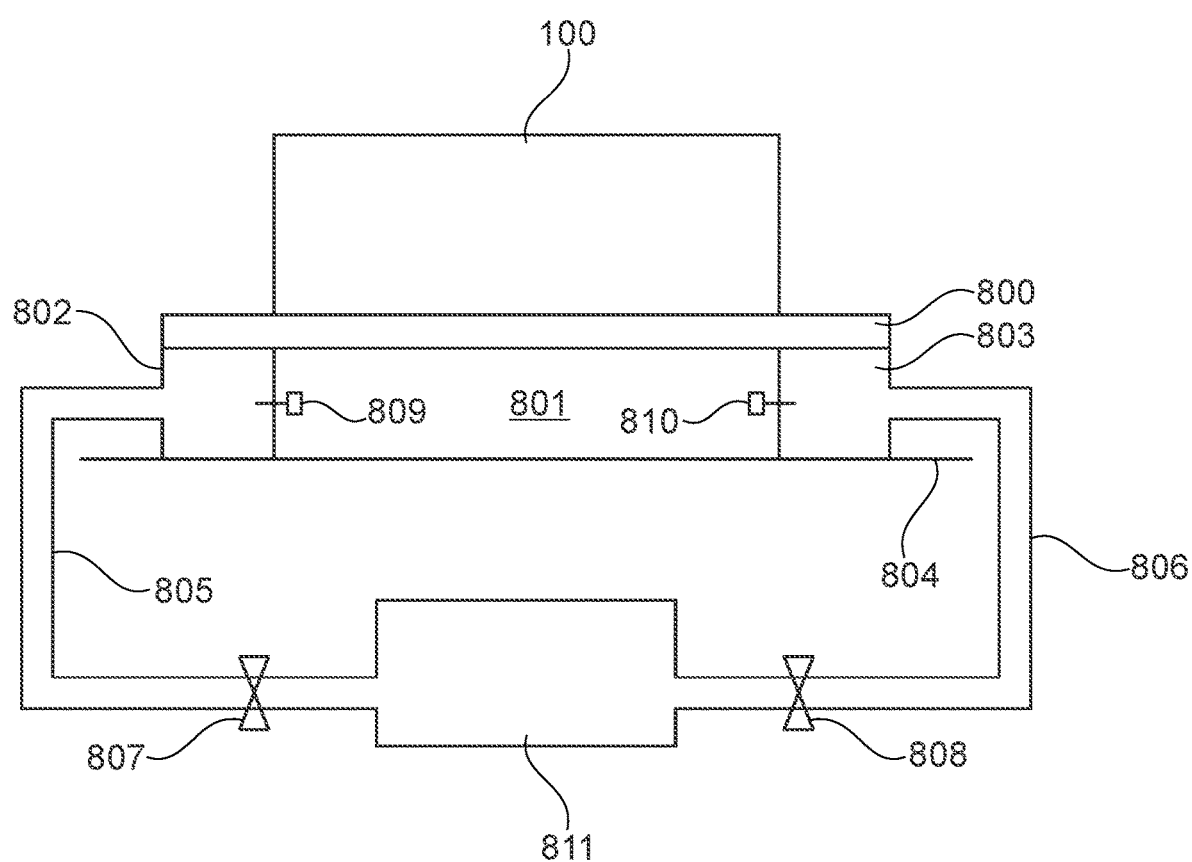
FIG. 11 shows a schematic representation of a pressure system in the form of a damping unit.

A schematic representation of a damping unit 801 is shown in FIG. 11 with respect to the SEM 100 according to FIG. 1. The damping unit 801 comprises a mounting plate 800. The SEM 100 is arranged at the mounting plate 800. Moreover, a plurality of pressure reservoirs of the damping unit 801 is arranged at the mounting plate 800. FIG. 11 shows two of the pressure reservoirs, namely a first pressure reservoir 802 and a second pressure reservoir 803. The pressure reservoirs of the damping unit 801 are arranged at a flooring 804 of a room. The damping unit 801 is used for damping vibrations which might be transferred to the aforementioned SEM 100 via the flooring 804.

The first pressure reservoir 802 and the second pressure reservoir 803 are filled with air to damp the above mentioned vibrations. For filling the first pressure reservoir 802 with air, the first pressure reservoir 802 is in fluid connection with a pump 811 via a first damping unit conduit 805. A first damping unit valve 807 is arranged between the first pressure reservoir 802 and the pump 811. The fluid connection between the first pressure reservoir 802 and the pump 811 may be connected or disconnected using the first damping unit valve 807. A first damping pressure measuring unit 809 is arranged at the first pressure reservoir 802 for measuring a reservoir pressure within the first pressure reservoir 802.

For filling the second pressure reservoir 803 with air, the second pressure reservoir 803 is in fluid connection with the pump 811 via a second damping unit conduit 806. A second damping unit valve 808 is arranged between the second pressure reservoir 803 and the pump 811. The fluid connection between the second pressure reservoir 803 and the pump 811 may be connected or disconnected using the second damping unit valve 808. A second damping pressure measuring unit 810 is arranged at the second pressure reservoir 803 for measuring a reservoir pressure within the second pressure reservoir 803.

The pump circle of the pressure reservoirs of the damping unit 801 is described hereinafter with respect to the first pressure reservoir 802. The pump circles of the further pressure reservoirs of the damping unit 801 are identical to the pump circle of the first pressure reservoir 802.

The pump 811 is used for pumping air or gas into the first pressure reservoir 802, wherein a reservoir pressure exists in the first pressure reservoir 802. The reservoir pressure may be equal to or higher than 1 hPa. When the reservoir pressure reaches an upper threshold, for example 1.2 hPa, the pump 811 is disconnected from the first pressure reservoir 802. In other words, the first damping unit valve 807 is closed such that the fluid connection between the first pressure reservoir 802 and the pump 811 is disrupted. The reservoir pressure existing in the first pressure reservoir 802 decreases. When the reservoir pressure reaches a given pressure threshold of the reservoir pressure, for example 0.5 hPa, the pump 811 is connected again to the first pressure reservoir 802 by opening the first damping unit valve 807. The first pressure reservoir 802 is filled with air or gas again using the pump 811 until the reservoir pressure reaches the upper threshold again. When the upper threshold is reached, the pump circle starts over again.

Figure 12:
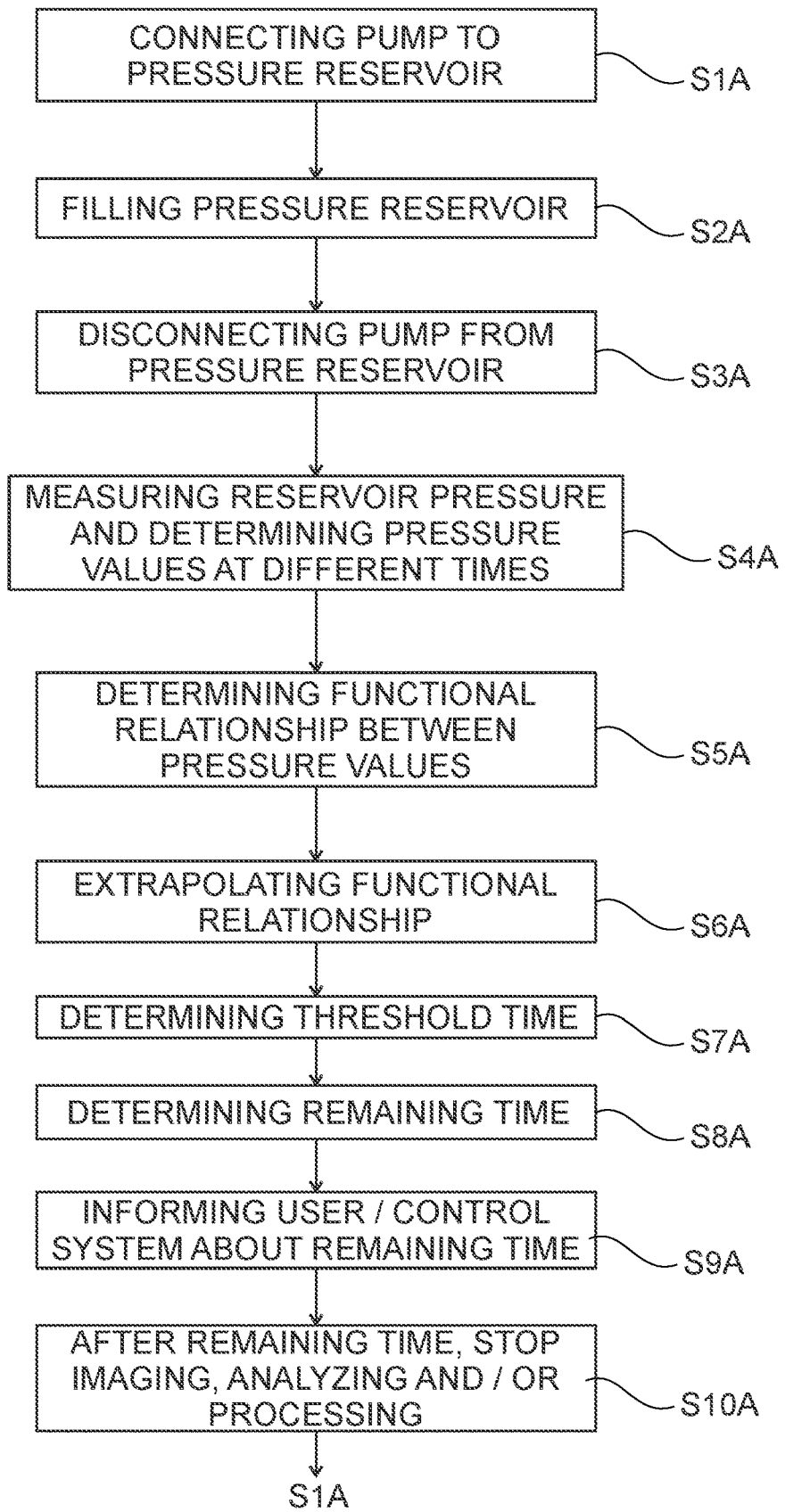
FIG. 12 shows a flow chart of an embodiment of a method for operating a pressure system in the form of a damping unit.

FIG. 12 shows the embodiment of the method according to the system described herein used for the first pressure reservoir 802. In method step S1A, the first pressure reservoir 802 is connected to the pump 811 by opening the first damping unit valve 807. The pump 811 is used for pumping air or gas into the first pressure reservoir 802, wherein a reservoir pressure exists in the first pressure reservoir 802. The reservoir pressure may be equal to or higher than 1 hPa. When the reservoir pressure reaches an upper threshold, for example 1.2 hPa, the pump 811 is disconnected from the first pressure reservoir 802 in method step S3A. In other words, the first damping unit valve 807 is closed such that the fluid connection between the first pressure reservoir 802 and the pump 811 is disrupted.

As mentioned above, the reservoir pressure existing in the first pressure reservoir 802 decreases. Therefore, in method step S4A, this reservoir pressure is measured using the first damping measuring unit 809. Pressure values of the reservoir pressure are determined at different times. More precisely, at least one first pressure value of the reservoir pressure at a first time T1 and at least a second pressure value of the reservoir pressure at a second time T2 are determined, wherein T2 is later than T1. In other embodiments, the method comprises determining more than two pressure values of the reservoir pressure, in particular 5, 10, 15, 20 or up to 100 pressure values of the reservoir pressure, wherein each pressure value of the reservoir pressure is determined at a different time.

Figure 13:
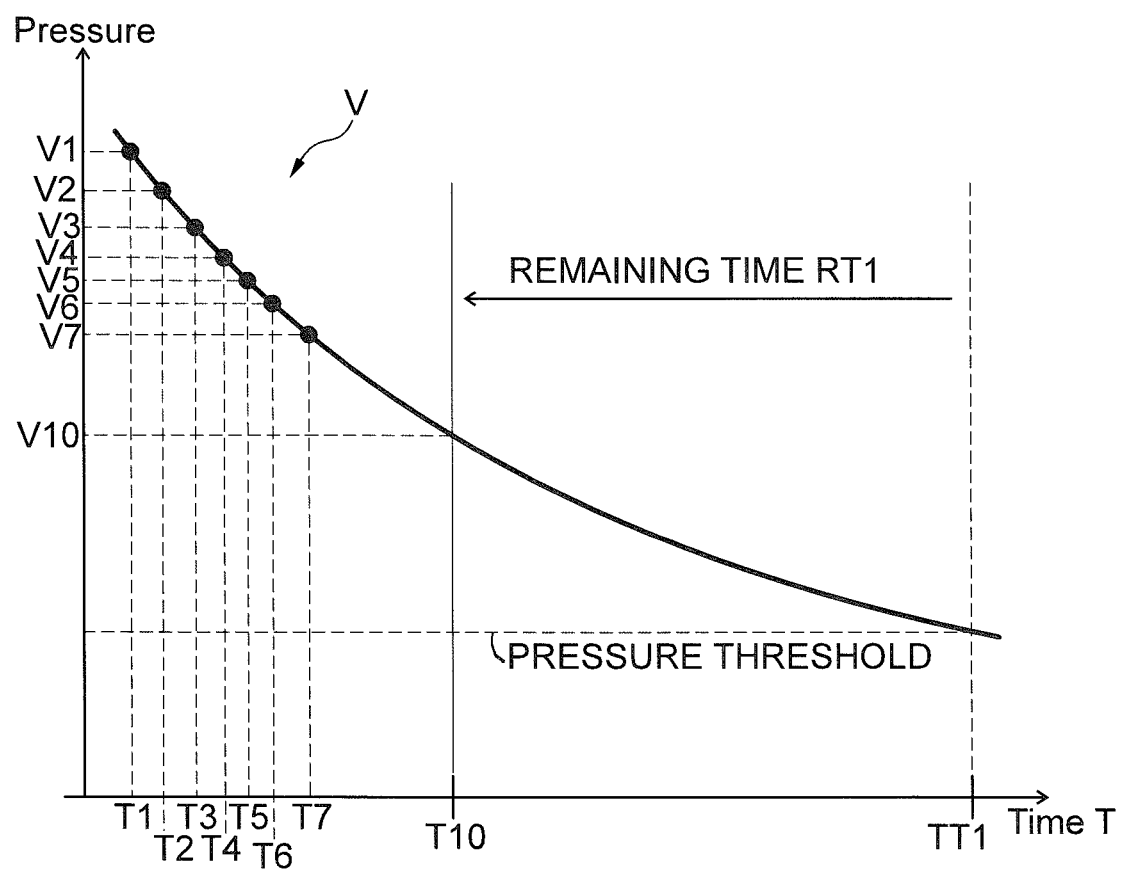
FIG. 13 shows a schematic representation of a reservoir pressure existing in a pressure reservoir as dependent on time.

FIG. 13 shows a schematic representation of the reservoir pressure existing in the first pressure reservoir 802 as dependent on time. 10 pressure values of the reservoir pressure were determined at different times. More precisely, a first pressure value V1 of the reservoir pressure at a first time T1, a second pressure value V2 of the reservoir pressure at a second time T2, a third pressure value V3 of the reservoir pressure at a third time T3, a fourth pressure value V4 of the reservoir pressure at a fourth time T4, a fifth pressure value V5 of the reservoir pressure at a fifth time T5, a sixth pressure value V6 of the reservoir pressure at a sixth time T6, a seventh pressure value V7 of the reservoir pressure at a seventh time T7, an eighth pressure value V8 of the reservoir pressure at an eighth time T8, a ninth pressure value V9 of the reservoir pressure at a ninth time T9 and a tenth pressure value V10 of the reservoir pressure at a tenth time T10 are determined. For reasons of clarity, only the first time T1 to the seventh time T7 and the tenth time T10 are denoted in FIG. 13. Moreover, the pressure values V1 to V10 are denoted altogether by the letter V.

In method step S5A the pressure values V1 to V10 are used for determining a functional relationship between the pressure values V1 to V10. The functional relationship is a function of time. The functional relationship may be a linear relationship or a nonlinear relationship. A step function may also be comprised by the functional relationship or form the functional relationship. The functional relationship may be determined by different methods. By way of example, the functional relationship may be determined by an interpolation. Any suitable interpolation method, for example a linear interpolation, a nonlinear interpolation, a trigonometric interpolation, a logarithmic interpolation and/or a spline interpolation, may be used in the interpolation. In addition and/or as an alternative thereto, functional relationship may be determined by extrapolation. Any suitable extrapolation method, for example a linear extrapolation, a nonlinear extrapolation, a trigonometric extrapolation and/or a logarithmic extrapolation, may be used in the extrapolation. As an alternative or in addition thereto, the functional relationship may be determined by forming an average, ascertaining random values and/or determining the smallest value or the largest value from the set of the pressure values V1 to V10.

The determined functional relationship may be the following function:

$$p(t) = p_0 + h \cdot \left(1 - \exp\left(\frac{t}{t_0}\right)\right)$$

wherein $p_0$ is the reservoir pressure of the first pressure reservoir 802 at an initial time $t_0$ and wherein h is a specifiable constant. The variables $p_0$, $t_0$ and h may be fitting parameters for determining the functional relationship.

In method step S6A, the determined functional relationship will be extrapolated for times later than the latest time at which a pressure value of the reservoir pressure of the first pressure reservoir 802 has been measured. In the embodiment shown in FIG. 13, the tenth time T10 is the latest time. Therefore, the determined functional relationship is extrapolated for times T later than T10. By extrapolating the functional relationship, it is determined how the vacuum reservoir pressure of the first pressure reservoir 802 increases or decreases after the tenth time T10.

In a further method step S7A, a threshold time TT1 is determined using the extrapolated function (see FIG. 13). The threshold time TT1 is a time when the extrapolated functional relationship reaches a pressure threshold given for the reservoir pressure of the first pressure reservoir 802. The pressure threshold may be given by the user and/or the control system 701 of the SEM 100. For example, the pressure threshold is 0.5 hPa. The pressure threshold is a pressure value which should not be undershot, otherwise the pressure in the first pressure reservoir 802 is not sufficient anymore for providing good damping.

In a further method step S8A, a remaining time period RT1 is determined. The remaining time period RT1 is the time elapsing until the reservoir pressure of the first pressure reservoir 802 reaches the pressure threshold. The first remaining time period RT1 is a time difference between the threshold time TT1 and the latest time at which a pressure value of the reservoir pressure of the first pressure reservoir 802 has been measured. In the embodiment of FIG. 13, the tenth time T10 is the latest time. In other words, the remaining time period RT1 corresponds to the time which is left until the reservoir pressure of the first pressure reservoir 802 reaches the pressure threshold.

In a further method step S9A, the user and/or the control system 701 of the SEM 100 are informed about the remaining time period RT1. In particular, the remaining time period RT1 may be displayed to the user.

In a further method step S10A, imaging, analyzing and/or processing the object 114 are/is stopped when reaching the threshold time TT1 and after the remaining time period RT1. This way, no imaging, analyzing and/or processing the object 114 is carried out during the disturbances caused by the above-mentioned pump 811 and the first damping unit valve 807.

After method step S10A, the method according to the system described herein may start from method step S1A again. Therefore, the method according to the system described herein may be a circle method.

Various embodiments discussed herein may be combined with each other in appropriate combinations in connection with the system described herein. Additionally, in some instances, the order of steps in the flow diagrams, flowcharts and/or described flow processing may be modified, where appropriate. Further, various aspects of the system described herein may be implemented using software, hardware, a combination of software and hardware and/or other computer-implemented modules or devices having the described features and performing the described functions. The system may further include a display and/or other computer components for providing a suitable interface with a user and/or with other computers.

Software implementations of aspects of the system described herein may include executable code that is stored in a computer-readable medium and executed by one or more processors. The computer-readable medium may include volatile memory and/or non-volatile memory, and may include, for example, a computer hard drive, ROM, RAM, flash memory, portable computer storage media such as a CD-ROM, a DVD-ROM, an SO card, a flash drive or other drive with, for example, a universal serial bus (USB) interface, and/or any other appropriate tangible or non-transitory computer-readable medium or computer memory on which executable code may be stored and executed by a processor. The system described herein may be used in connection with any appropriate operating system.

Other embodiments of the system described herein will be apparent to those skilled in the art from a consideration of the specification and/or an attempt to put into practice the system described herein disclosed herein. It is intended that the specification and examples be considered as exemplary only, with the true scope and spirit of the invention being indicated by the following claims.

The invention claimed is:

1. A method of operating a pressure system of a device for imaging, analyzing and/or processing an object, the method comprising:
   a) disconnecting a pump from a pressure reservoir;
   b) measuring a reservoir pressure existing in the pressure reservoir, and determining at least one first pressure value of the reservoir pressure at a first time and at least one second pressure value of the reservoir pressure at a second time, wherein the second time is later than the first time;
   c) determining a functional relationship between the first pressure value of the reservoir pressure and the second pressure value of the reservoir pressure, wherein the functional relationship is a function of time;
   d) extrapolating the functional relationship for times later than the second time;
   e) determining a threshold time using the extrapolated functional relationship, wherein the threshold time is a time when the extrapolated functional relationship reaches a pressure threshold given for the reservoir pressure;
   f) determining a remaining time period until the reservoir pressure reaches the pressure threshold, wherein the remaining time period is a time difference between threshold time and the second time; and
   g) supplying information about the remaining time period to a user and/or a control system of the device.

2. The method according to claim 1, the method further comprising one of the following:
   (i) the pressure reservoir is a vacuum reservoir and the reservoir pressure is a vacuum reservoir pressure, wherein the pressure threshold is an upper threshold and wherein, after disconnecting the pump from the vacuum reservoir, the vacuum reservoir is connected to a vacuum chamber of the device; and
   (ii) the pressure reservoir is an overpressure reservoir of a damping unit and the reservoir pressure is an overpressure reservoir pressure, wherein the pressure threshold is a lower threshold.

3. The method according to claim 1, the method further comprising:
   stopping imaging, analyzing and/or processing the object after the remaining time period and at the threshold time; and
   connecting the pump to the pressure reservoir.

4. The method according to claim 2, wherein, if the pressure reservoir is a vacuum reservoir, the method further comprises disconnecting the vacuum reservoir from the vacuum chamber.

5. The method according to claim 1, wherein the pressure reservoir is a first pressure reservoir, wherein the reservoir pressure is a first reservoir pressure, wherein the pump is a first pump, wherein the pressure threshold is a first pressure threshold, wherein the threshold time is a first threshold time and wherein the functional relationship is a first functional relationship, the method further comprising:
   a) disconnecting a second pump from a second pressure reservoir;
   b) measuring a second reservoir pressure existing in the second pressure reservoir, and determining at least one first pressure value of the second reservoir pressure at a third time and at least one second pressure value of the second reservoir pressure at a fourth time, wherein the fourth time is later than the third time;
   c) determining a second functional relationship between the first pressure value of the second reservoir pressure and the second pressure value of the second reservoir pressure, wherein the second functional relationship is a second function of time;
   d) extrapolating the second functional relationship for times later than the fourth time;
   e) determining a second threshold time using the extrapolated second functional relationship, wherein the second threshold time is a time when the extrapolated second functional relationship reaches a second pressure threshold given for the second reservoir pressure;
   f) determining a second remaining time period until the second reservoir pressure reaches the second pressure threshold, wherein the second remaining time period is the time difference between second threshold time and the fourth time; and
   g) supplying information about the second remaining time period to the user and/or the control system of the device.

6. The method according to claim 5, the method further comprising one of the following:
   (i) the second pressure reservoir is a second vacuum reservoir and the reservoir pressure is a second vacuum reservoir pressure, wherein the second pressure threshold is a second upper threshold and wherein, after disconnecting the second pump from the second vacuum reservoir, the second vacuum reservoir is connected to the vacuum chamber of the device;
   (ii) the second pressure reservoir is a second overpressure reservoir of the damping unit and the second reservoir pressure is a second overpressure reservoir pressure, wherein the second pressure threshold is a lower threshold.

7. The method according to claim 5, comprising at least one of the following features:
   the first pump is identical to the second pump;
   the first functional relationship is identical to the second functional relationship.

8. The method according to claim 5, the method further comprising one of the following:
   (i) informing the user and/or the control system of the device about which one of the first remaining time period and the second remaining time period is the shorter remaining time period;
   (ii) informing the user and/or the control system of the device about the shorter remaining time period of the first remaining time period and the second remaining time period if the time difference between the first remaining time period and the second remaining time period is shorter than two minutes or one minute.

9. A method of operating a pressure system of a device for imaging, analyzing and/or processing an object, the method comprising:
   a) disconnecting a pump from a pressure reservoir;
   b) measuring a reservoir pressure existing in the pressure reservoir, and determining when the reservoir pressure reaches a pressure threshold given for the reservoir pressure;
   c) stopping imaging, analyzing and/or processing the object during a given delay after the reservoir pressure has reached the pressure threshold; and
   d) connecting the pump to the pressure reservoir.

10. The method according to claim 9, the method further comprising one of the following:
    (i) the pressure reservoir is a vacuum reservoir and the reservoir pressure is a vacuum reservoir pressure, wherein the pressure threshold is an upper threshold and wherein, after disconnecting the pump from the vacuum reservoir, the vacuum reservoir is connected to a vacuum chamber of the device, and wherein the vacuum reservoir is disconnected from the vacuum chamber with the given delay after the vacuum reservoir pressure has reached the pressure threshold;
    (ii) the pressure reservoir is an overpressure reservoir of a damping unit and the reservoir pressure is an overpressure reservoir pressure, wherein the pressure threshold is a lower threshold.

11. A computer program product comprising a program code which is loaded into a processor and which, when being executed, controls a particle beam device for imaging, analyzing and/or processing an object in such a way that a method operating a pressure system of the particle beam device is carried out, the method comprising:
    disconnecting a pump from a pressure reservoir;
    measuring a reservoir pressure existing in the pressure reservoir, and determining at least one first pressure value of the reservoir pressure at a first time and at least one second pressure value of the reservoir pressure at a second time, wherein the second time is later than the first time;
    determining a functional relationship between the first pressure value of the reservoir pressure and the second pressure value of the reservoir pressure, wherein the functional relationship is a function of time;
    extrapolating the functional relationship for times later than the second time;
    determining a threshold time using the extrapolated functional relationship, wherein the threshold time is a time when the extrapolated functional relationship reaches a pressure threshold given for the reservoir pressure;
    determining a remaining time period until the reservoir pressure reaches the pressure threshold, wherein the remaining time period is a time difference between the threshold time and the second time; and
    supplying information about the remaining time period to a user and/or a control system of the particle beam device.

12. The computer program product of claim 11, wherein the method further comprises one of the following:
    the pressure reservoir is a vacuum reservoir and the reservoir pressure is a vacuum reservoir pressure, wherein the pressure threshold is an upper threshold and wherein, after disconnecting the pump from the vacuum reservoir, the vacuum reservoir is connected to a vacuum chamber of the device; and the pressure reservoir is an overpressure reservoir of a damping unit and the reservoir pressure is an overpressure reservoir pressure, wherein the pressure threshold is a lower threshold.

13. The computer program product of claim 11, wherein the method further comprises:

stopping imaging, analyzing and/or processing the object after the remaining time period and at the threshold time; and connecting the pump to the pressure reservoir.

14. The computer program product of claim 11, wherein if the pressure reservoir is a vacuum reservoir, the method further comprises disconnecting the vacuum reservoir from the vacuum chamber.

15. A particle beam device for imaging, analyzing and/or processing an object, comprising at least one particle generator for generating a particle beam having charged particles, at least one objective lens for focusing the particle beam onto the object, at least one detector for detecting interaction particles and/or interaction radiation, the interaction particles and the interaction radiation being generated when the particle beam impinges on the object, a vacuum chamber, at least one pressure reservoir, at least one pump adapted to be in fluid connection with the pressure reservoir, and a processor into which program code of a computer program product is loaded, wherein the program code when executed controls the particle beam device in such a way that a method operating a pressure system of the particle beam device is carried out, the method comprising:

disconnecting the at least one pump from the at least one pressure reservoir;

measuring a reservoir pressure existing in the at least one pressure reservoir, and determining at least one first pressure value of the reservoir pressure at a first time and at least one second pressure value of the reservoir pressure at a second time, wherein the second time is later than the first time;

determining a functional relationship between the first pressure value of the reservoir pressure and the second pressure value of the reservoir pressure, wherein the functional relationship is a function of time;

extrapolating the functional relationship for times later than the second time;

determining a threshold time using the extrapolated functional relationship, wherein the threshold time is a time when the extrapolated functional relationship reaches a pressure threshold given for the reservoir pressure;

determining a remaining time period until the reservoir pressure reaches the pressure threshold, wherein the remaining time period is a time difference between the threshold time and the second time; and supplying information about the remaining time period to a user and/or a control system of the particle beam device.

16. The particle beam device according to claim 15, wherein the pressure reservoir is one of the following:

(i) a vacuum reservoir adapted to be in fluid connection with the vacuum chamber;

(ii) an overpressure reservoir of a damping unit.

17. The particle beam device according to claim 15, wherein the pressure reservoir is a lock chamber.

18. The particle beam device according to claim 15, wherein the particle generator is a first particle beam generator for generating a first particle beam having first charged particles, wherein the objective lens is a first objective lens for focusing the first particle beam onto the object, and wherein the particle beam device further comprises: a second particle beam generator for generating a second particle beam having second charged particles and a second objective lens for focusing the second particle beam onto the object.

19. The particle beam device according to claim 15, wherein the particle beam device is at least one of the following: an electron beam device and an ion beam device.

* * * * *